United States Patent
Nomura

(10) Patent No.: US 9,647,135 B2
(45) Date of Patent: May 9, 2017

(54) TIN BASED P-TYPE OXIDE SEMICONDUCTOR AND THIN FILM TRANSISTOR APPLICATIONS

(71) Applicant: Snaptrack, Inc., San Diego, CA (US)

(72) Inventor: Kenji Nomura, San Jose, CA (US)

(73) Assignee: SNAPTRACK, INC., San Diego, CA (US)

(*) Notice: Subject to any disclaimer, the term of this patent is extended or adjusted under 35 U.S.C. 154(b) by 74 days.

(21) Appl. No.: 14/603,186

(22) Filed: Jan. 22, 2015

(65) Prior Publication Data

US 2016/0218223 A1    Jul. 28, 2016

(51) Int. Cl.
    G09G 5/00        (2006.01)
    H01L 29/786      (2006.01)
    H01L 29/66       (2006.01)
    H01L 27/12       (2006.01)
    G09G 3/20        (2006.01)
    G09G 3/34        (2006.01)
    H01L 21/02       (2006.01)
    H01L 21/477      (2006.01)
    H01L 29/24       (2006.01)

(52) U.S. Cl.
    CPC ..... *H01L 29/78693* (2013.01); *G09G 3/2096* (2013.01); *G09G 3/3466* (2013.01); *H01L 21/0262* (2013.01); *H01L 21/02565* (2013.01); *H01L 21/477* (2013.01); *H01L 27/1225* (2013.01); *H01L 27/1251* (2013.01); *H01L 29/24* (2013.01); *H01L 29/66969* (2013.01); *H01L 29/7869* (2013.01)

(58) Field of Classification Search
    CPC .... G09G 3/2092; G09G 3/2096; G09G 5/006; H01L 21/02; H01L 21/02414; H01L 21/02565; H01L 21/02579; H01L 29/1054; H01L 29/78606; H01L 29/78693; H01L 29/78696
    See application file for complete search history.

(56) References Cited

U.S. PATENT DOCUMENTS 7,189,992 B2    3/2007  Wager, III et al.
7,297,977 B2 *  11/2007  Hoffman ............ H01L 29/7869
                                                    257/43

(Continued)

OTHER PUBLICATIONS

"P-type Mn-doped SnO2 oxide semiconductor materials prepared by a sol-gel method" by Lee et al, The Korean Ceramic Society 2011, 1 page.*

(Continued)

*Primary Examiner* — Joe H Cheng
(74) *Attorney, Agent, or Firm* — Weaver Austin Villeneuve & Sampson LLP

(57) ABSTRACT

This disclosure provides p-type metal oxide semiconductor thin films that display good thin film transistor (TFT) characteristics. The p-type metal oxide thin films include ternary or higher order tin-based (Sn-based) p-type oxides such as Sn (II)-M-O oxides where M is a metal. In some implementations, M is a metal selected from the d block or the p block of the periodic table. The oxides disclosed herein exhibit p-type conduction and wide bandgaps. Also provided are TFTs including channels that include p-type oxide semiconductors, and methods of fabrication. In some implementations, the p-channel TFTs have low off-currents.

26 Claims, 16 Drawing Sheets

(56) References Cited

U.S. PATENT DOCUMENTS

| | | | |
|---|---|---|---|
| 7,462,862 B2 | 12/2008 | Hoffman et al. | |
| 7,564,055 B2 | 7/2009 | Hoffman | |
| 7,838,348 B2 | 11/2010 | Hoffman et al. | |
| 8,653,516 B1 | 2/2014 | Nelson et al. | |
| 8,748,222 B2 | 6/2014 | Shinn et al. | |
| 8,890,150 B2* | 11/2014 | Sasaki | H01L 29/7869 257/59 |
| 2005/0133917 A1 | 6/2005 | Hoffman et al. | |
| 2007/0069209 A1 | 3/2007 | Jeong et al. | |
| 2008/0090341 A1* | 4/2008 | Tanaka | G02F 1/136227 438/158 |
| 2008/0224133 A1* | 9/2008 | Park | H01L 21/02554 257/43 |
| 2010/0140609 A1* | 6/2010 | Yano | H01L 29/7869 257/43 |
| 2011/0089444 A1 | 4/2011 | Yao et al. | |
| 2011/0097492 A1 | 4/2011 | Kerr et al. | |
| 2011/0253997 A1 | 10/2011 | Park et al. | |
| 2011/0309356 A1 | 12/2011 | Yabuta et al. | |
| 2012/0282733 A1 | 11/2012 | Lee et al. | |
| 2013/0075740 A1 | 3/2013 | Correia Fortunato et al. | |
| 2013/0217180 A1 | 8/2013 | Facchetti et al. | |
| 2013/0241881 A1 | 9/2013 | Jeon et al. | |
| 2013/0280859 A1 | 10/2013 | Kim et al. | |
| 2013/0292668 A1* | 11/2013 | Oh | H01L 29/66969 257/43 |
| 2014/0077206 A1 | 3/2014 | Sunamura et al. | |
| 2014/0159035 A1 | 6/2014 | Park et al. | |
| 2014/0183525 A1 | 7/2014 | Kaneko et al. | |
| 2014/0217396 A1 | 8/2014 | Imamura et al. | |
| 2014/0353648 A1 | 12/2014 | Abe et al. | |
| 2015/0162191 A1 | 6/2015 | Saly et al. | |
| 2016/0133751 A1* | 5/2016 | Nomura | H01L 29/66969 345/520 |
| 2016/0190290 A1 | 6/2016 | Nomura et al. | |

OTHER PUBLICATIONS

Batzill M., et al., "The Surface and Materials Science of Tin Oxide", Progress in Surface Science, Elsevier, vol. 79, Issues 2-4, 2005, pp. 47-154.

International Search Report and Written Opinion—PCT/US2015/064131—ISA/EPO—Feb. 24, 2016.

Office Action dated Feb. 26, 2016, issued in U.S. Appl. No. 14/586,282.

Final Office Action dated Jul. 29, 2016, issued in U.S. Appl. No. 14/586,282.

Song, et al., "Effect of Post-Deposition Treatment on Characteristics of P-channel SnO Thin-Film Transistors", International Journal of Digital Content Technology and its Applications (JDCTA), vol. 7, No. 12, Aug. 2013, 6 pages.

Han J.H., et al., "Growth of p-Type Tin(II) Monoxide Thin Films by Atomic Layer Deposition from Bis(1-dimethylamino-2-methyl-2propoxy)tin and H2O," Chemistry of Materials, 2014, vol. 26 (21), pp. 6088-6091.

Hsu P.C., et al., "Fabrication of p-Type SnO Thin-Film Transistors by Sputtering with Practical Metal Electrodes," Japanese Journal of Applied Physics, 2013, vol. 52, pp. 05DC07-1-05DC07-6.

Hsu P.C., et al., "Sputtering Deposition of P-type SnO Films with SnO2 Target in Hydrogen-Containing Atmosphere," ACS Applied Materials & Interfaces, 2014, vol. 6 (16), pp. 13724-13729.

International Search Report and Written Opinion—PCT/US2015/064130—ISA/EPO—Mar. 2, 2016.

Janotti A. "Defects and Doping in Oxides: What we Have Learned So Far," Materials UC Santa Barbara, Sold State Lighting and Energy Center, Feb. 23, 2010, 39 pages.

Jeffrey E., et al., "Atomic Layer Deposition of Tin Oxide Films using tetrakis(dimethylamino) tin," Journal of Vacuum Science and Technology: Part at AVS /AIP, Melville, NY, US, Jan. 29, 2008 (Jan. 29, 2008), vol. 26, No. 2, pp. 244-252, XP012113850, ISSN: 0734-2101, DOI: 10.1116/1.2835087.

Kook L.B., et al., "Physical/chemical Properties of Tin Oxide Thin Film Transistors Prepared using Plasma-enhanced Atomic Layer Deposition," Materials Research Bulletin, Apr. 26, 2012 (Apr. 26, 2012), vol. 47, No. 10, pp. 3052-3055, XP028937675, ISSN: 0025-5408, DOI: 10.1016/J.MATERRESBULL.2012.04.120 p. 3052.

Lee H N., et al., "p-Channel Tin Monoxide Thin Film Transistor Fabricated by Vacuum Thermal Evaporation," Jpn. J. Appl. Phys., 49, Issue 2R., 2010, pp. 020202-1-020202-3.

Ozmen B., "Solution Deposition and Characterization of the Thin Film Inorganic Materials", An Abstract of the Thesis, Bahar Ozmen for the degree of Master of Science in Chemistry presented on Jul. 16, 2007, 66 pages.

Sathees K.S., et al., "Growth Behavior and Properties of Atomic Layer Deposited Tin Oxide on Silicon from Novel Tin(II)acetylacetonate Precursor and Ozone," Journal of Vacuum Science and Technology: Part A, AVS /AIP, Melville, NY, US, Dec. 4, 2013 (Dec. 4, 2013), vol. 32, No. 1, 01A112, pp. 1-6, XP012179046, ISSN: 0734-2101, DOI: 10.1116/1.4837915 [retrieved on Jan. 1, 1901].

Varley A. et al.,"Ambipolar Doping in SnO," Appl. Phys. Lett., 103, 2013, pp. 082118-1-082118-4.

Office Action dated Dec. 28, 2016, issued in U.S. Appl. No. 14/586,282.

* cited by examiner

TIN BASED P-TYPE OXIDE SEMICONDUCTOR AND THIN FILM TRANSISTOR APPLICATIONS

TECHNICAL FIELD

This disclosure relates to thin film transistors and more particularly to tin-based p-channel metal oxide thin film transistors.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Hardware and data processing apparatus may be associated with electromechanical systems. Such hardware and data processing apparatus may include thin film transistors (TFTs). A TFT is a field-effect transistor that includes thin films of metal and semiconductor layers.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus having a thin film transistor (TFT), the TFT including a source electrode, a drain electrode, and a semiconductor channel connecting the source electrode and the drain electrode, the semiconductor channel including a ternary or higher order tin-based (Sn-based) p-type oxide. The ternary or higher order Sn-based p-type oxide may include Sn (II) and a metal selected from the d block or the p block of the periodic table in some implementations. The ternary or higher order Sn-based p-type oxide may include Sn (II) and one or more metals selected from Group 3 metals, Group 4 metals, tungsten (W), niobium (Nb), boron (B), aluminum (Al), gallium (Ga), lead (Pb), and silicon (Si). In some implementations, the Sn-based p-type oxide is a Sn-M-O ternary oxide, where Sn is Sn (II) and M is a metal selected from the d block or the p block of the periodic table. For example, an Sn-M-O ternary oxide may have the formula $Sn_xM_{1-x}O_z$, where x is at least 0.2 and z is greater than zero. In some implementations, x is between 0.2 and 0.8.

In some implementations, the Sn-based p-type oxide is Sn $(II)_xB_{1-x}O_z$, where x is between 0.7 and 0.9 and z is greater than zero. In some implementations, the Sn-based p-type oxide is one of Sn $(II)_xW_{1-x}O_z$, Sn $(II)_xTi_{1-x}O_z$ and Sn $(II)_xNb_{1-x}O_z$ where x is between 0.3 and 0.8 and z is greater than zero. In some implementations, the Sn-based p-type oxide may be a $Sn-M_1-M_2-O$ quaternary oxide, where Sn is Sn (II) and $M_1$ and $M_2$ are metals selected from the d block or the p block of the periodic table. In some implementations, the Sn-based p-type oxide has contributions from the Sn 5s orbital in its valence band maximum (VBM).

According to various implementations, the Sn-based p-type oxide may be amorphous or crystalline. In some implementations, the TFT is part of a complementary metal-oxide-semiconductor (CMOS) TFT device. The apparatus may have one or both of a bottom and top gate.

In some implementations, the apparatus may further include a display; a processor that is configured to communicate with the display, the processor being configured to process image data; and a memory device that is configured to communicate with the processor. The apparatus may further include a driver circuit configured to send at least one signal to the display; and a controller configured to send at least a portion of the image data to the driver circuit. The driver circuit may include the TFT. In some implementations, the apparatus may further include an image source module configured to send the image data to the processor, where the image source module includes at least one of a receiver, transceiver, and transmitter. The apparatus may include an input device configured to receive input data and to communicate the input data to the processor.

Another innovative aspect of the subject matter described in this disclosure can be implemented in an apparatus having a TFT including a drain electrode, a source electrode; and p-type semiconducting means to electrically connect the drain electrode and the source electrode. The may further include a gate electrode and a gate dielectric.

Another innovative aspect of the subject matter described in this disclosure can be implemented in a method including providing a substrate, forming a ternary or higher order tin-based (Sn-based) p-type oxide semiconductor layer on the substrate; and annealing the Sn-based p-type oxide semiconductor layer.

The ternary or higher order Sn-based p-type oxide may include Sn (II) and a metal selected from the d block or the p block of the periodic table in some implementations. The ternary or higher order Sn-based p-type oxide may include Sn (II) and one or more metals selected from Group 3 metals, Group 4 metals, tungsten (W), niobium (Nb), boron (B), aluminum (Al), gallium (Ga), lead (Pb), and silicon (Si). In some implementations, forming the Sn-based p-type oxide semiconductor layer involves an atomic layer deposition (ALD) process. The method may further include forming a gate electrode and a gate dielectric, wherein the gate dielectric is between the Sn-based p-type oxide semiconductor layer and the gate electrode.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
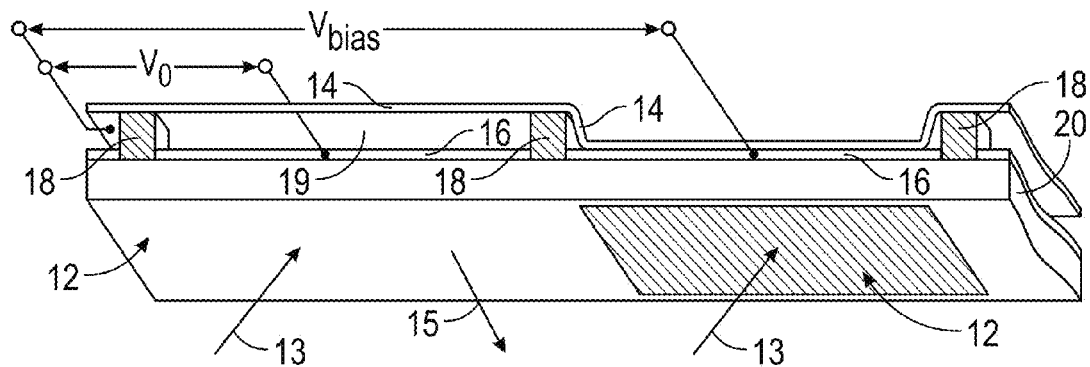
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations described herein relate to tin-based (Sn-based) p-type oxide semiconductor materials. The Sn-based oxide semiconductors disclosed herein include p-type ternary and higher order oxides that include Sn (II) cations and one or more additional metals. In some implementations, the Sn-based p-type oxide semiconductors include a metal from the d block or p block of the periodic table. In some implementations, the Sn-based p-type oxide semiconductors include one or more metals selected from Group 3 metals, Group 4 metals, tungsten (W), niobium (Nb), boron (B), aluminum (Al), gallium (Ga), and silicon (Si). The ternary or higher order Sn-based p-type oxides may have indirect bandgaps greater than 0.8 eV.

Implementations described herein relate to p-type thin film transistors (TFTs) having p-type channels that include ternary or higher order Sn-based p-type oxide semiconductor layers. In some implementations, p-type TFTs described herein may be used in complementary metal-oxide-semiconductor (CMOS) TFT devices, which include n-type TFTs and p-type TFTs.

Particular implementations of the subject matter described in this disclosure can be implemented to realize one or more of the following potential advantages. A ternary or higher order Sn-based p-type oxide semiconductor layer can be implemented in a p-type TFT to provide good TFT characteristics including high mobility and low off-current. A p-type TFT including a ternary or higher order Sn-based p-type oxide semiconductor may be implemented in a CMOS TFT circuit. Such TFT circuits may be integrated on a display backplate, for example as driver circuits, or in other electronic devices. This reduces manufacturing cost and failures associated with separately packaged integrated circuit (IC) drivers. A ternary or higher Sn-based p-type oxide semiconductor may be implemented in a flexible TFT disposed on a flexible substrate. Such TFTs may have significantly higher mobility as compared to flexible p-type TFTs having organic channels. CMOS structures including Sn-based oxide p-channel may have higher cut-off frequencies than CMOS structures having organic p-channels.

An example of a suitable EMS or MEMS device or apparatus, which may include some or all of the described implementations of the TFT, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex®, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 µm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
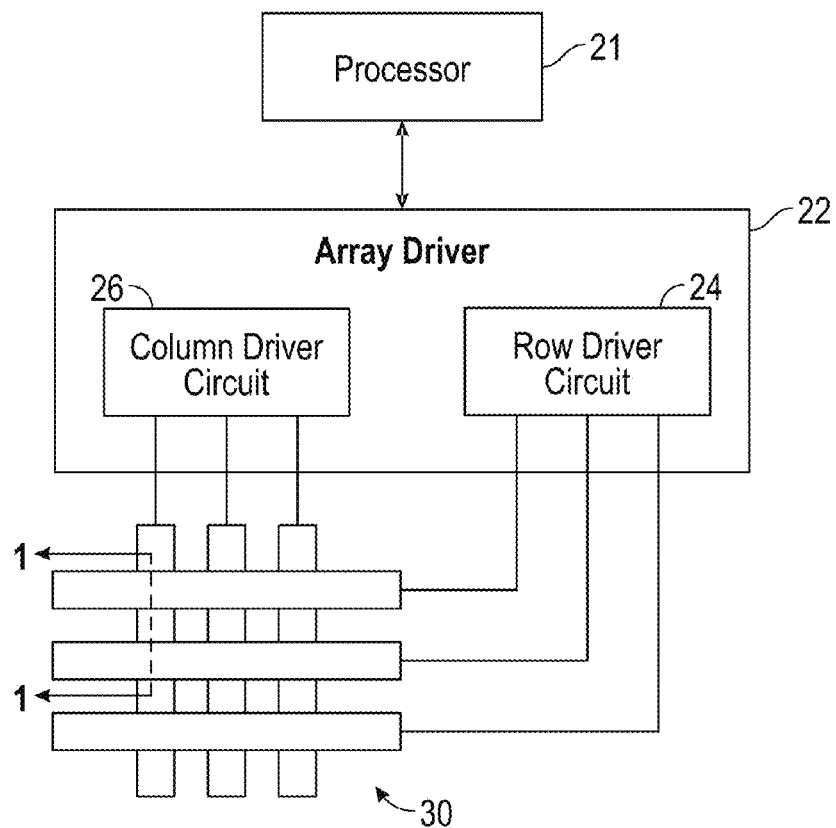
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. Such an electronic device may include implementations of the TFTs disclosed herein. For example, a complementary metal-oxide-semiconductor (CMOS) TFT device may be used as part of a driving circuit, for example, of the electronic device illustrated in FIG. 2. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
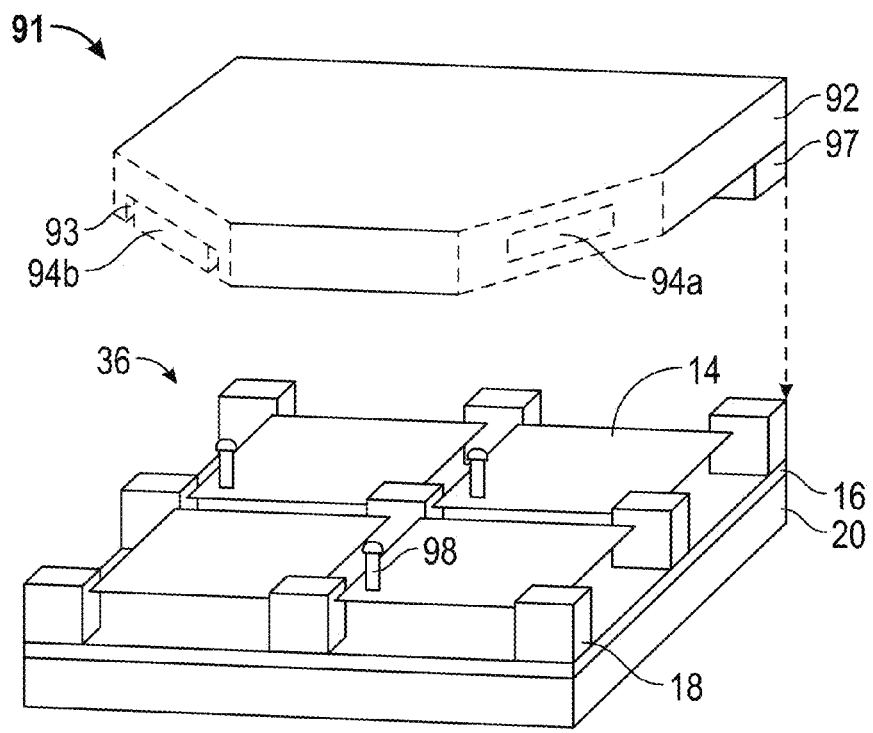
FIGS. 3A and 3B are schematic exploded partial perspective views of a portion of an electromechanical systems (EMS) package including an array of EMS elements and a backplate.
Figure 3B:
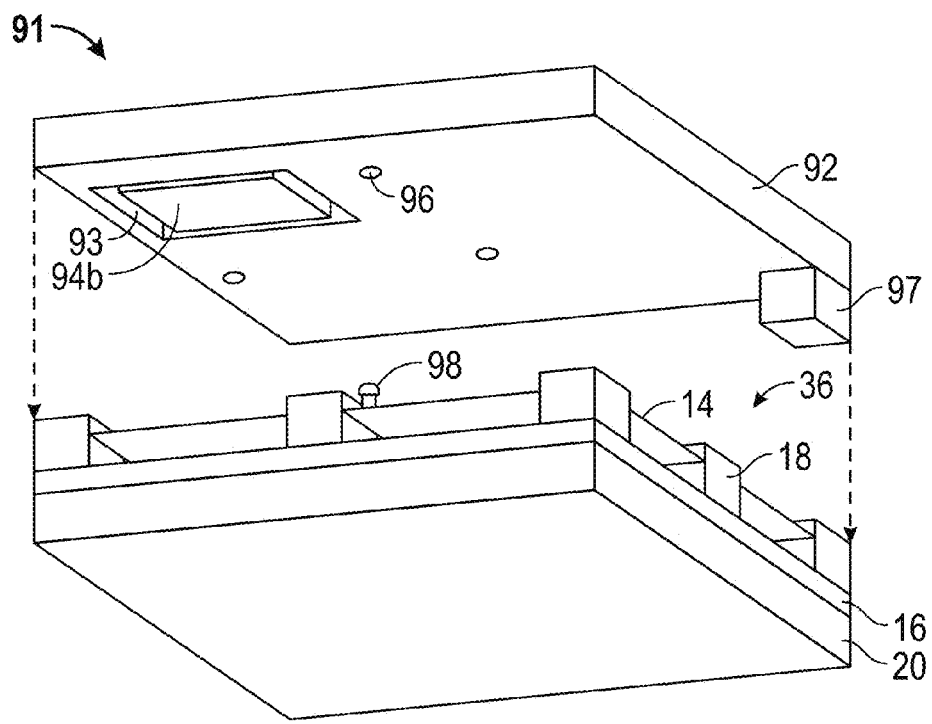

FIGS. 3A and 3B are schematic exploded partial perspective views of a portion of an EMS package 91 including an array 36 of EMS elements and a backplate 92. A TFT as disclosed herein may be implemented in the EMS package 91 shown in FIGS. 3A and 3B. For example, a TFT including a p-type metal oxide semiconductor channel may be implemented in a driver circuit on the backplate 92. FIG. 3A is shown with two corners of the backplate 92 cut away to better illustrate certain portions of the backplate 92, while FIG. 3B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Hardware and data processing apparatus may be associated with EMS structures. Such hardware and data processing apparatus may include a transistor switch, such as a thin film transistor (TFT). EMS display elements in a display device may be arranged in an array such as a two-dimensional grid and addressed by circuits associated with the rows and columns of the array. Row driver circuits may drive the gates of transistor switches that select a particular row to be addressed, and common driver circuits may provide a bias to a given row of display elements that may be synchronously updated with a row refresh.

A display device can include an array of display elements, which can be referred to as pixels. Some displays can include hundreds, thousands, or millions of pixels arranged in hundreds or thousands of rows and hundreds and thousands of columns. Each pixel can be driven by one or more TFTs. A TFT is a type of field-effect transistor made by depositing thin films of a semiconductor layer as well as one or more dielectric layers and conductive layers over a substrate. With increasing developments in flat panel displays, systems-on-glass, display devices, mobile devices, wearable devices, and the like, there is a growing demand for high performance TFTs.

Integrating switching matrices with driver circuits on a display backplate, as well as in other electronic devices, reduces manufacturing cost and failures associated with separately packaged IC drivers. Complementary metal-oxide-semiconductor (CMOS) circuits use n-type and p-type channels. Disclosed herein are p-type metal oxide semiconductor materials that exhibit good TFT performance, as well as TFTs including p-type metal oxide semiconductor channels. Also disclosed are circuits including n-type and p-type TFTs as well as electronic devices, such as display devices, that include such circuits. While the below description focuses on p-type metal oxide semiconductors in the context of TFTs in display applications, the p-type metal oxide semiconductors may also be employed in other contexts, such as in solar applications.

Figure 4A:
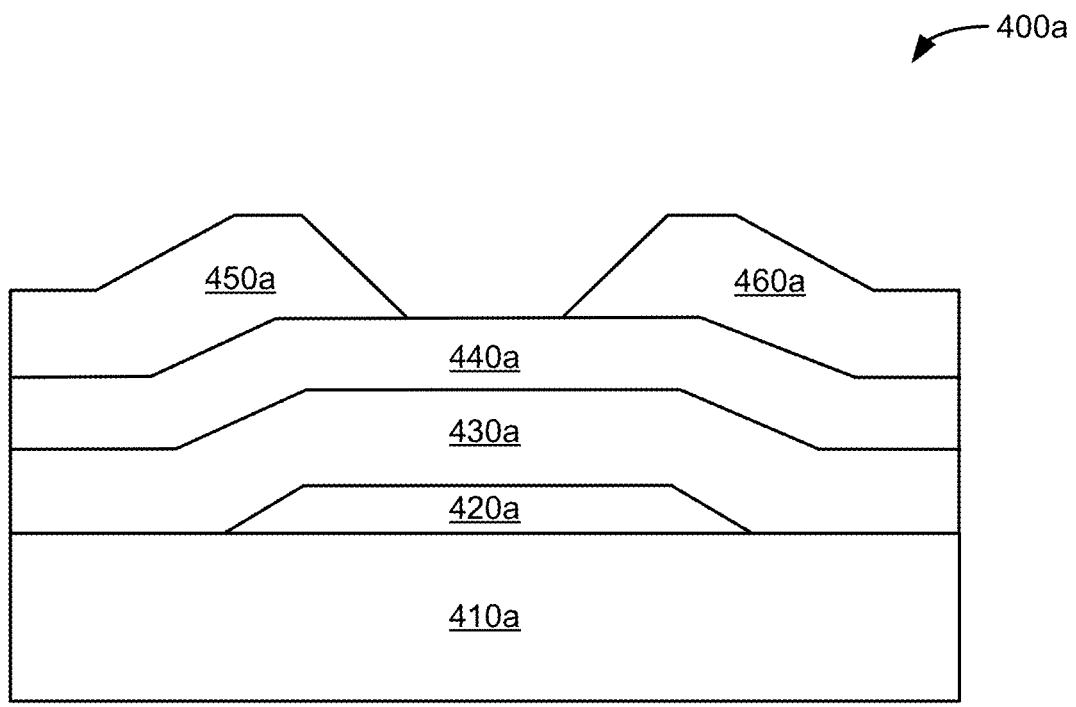
FIG. 4A is an example of a cross-sectional diagram illustrating a bottom gate thin film transistor (TFT) according to some implementations.

Generally, a TFT can include a semiconductor layer with a source region, a drain region, and a channel region in the semiconductor layer. As such, a TFT can be a three-terminal device that includes a source terminal, a drain terminal, and a gate terminal for modulating the conductivity of a channel within the TFT. Some types of TFTs can be defined in terms of the location of the gate terminal. For example, types of TFT geometries can include a bottom gate geometry and a top gate geometry. FIG. 4A is an example of a cross-sectional diagram illustrating a bottom gate TFT according to some implementations. In FIG. 4A, a bottom gate TFT 400a includes a substrate 410a, a gate electrode 420a over the substrate 410a, a gate dielectric 430a over the gate electrode 420a, a semiconductor layer 440a over the gate dielectric 430a, a source electrode 450a over a source region of the semiconductor layer 440a, and a drain electrode 460a over a drain region of the semiconductor layer 440a, where a channel region in the semiconductor layer 440a is between the source region and the drain region. The semiconductor layer 440a electrically connects the source electrode 450a and the drain electrode 460a, with conductivity in the channel region that can be modeled as a function of the potential applied across the gate electrode 420a and the source electrode 450a.

Figure 4B:
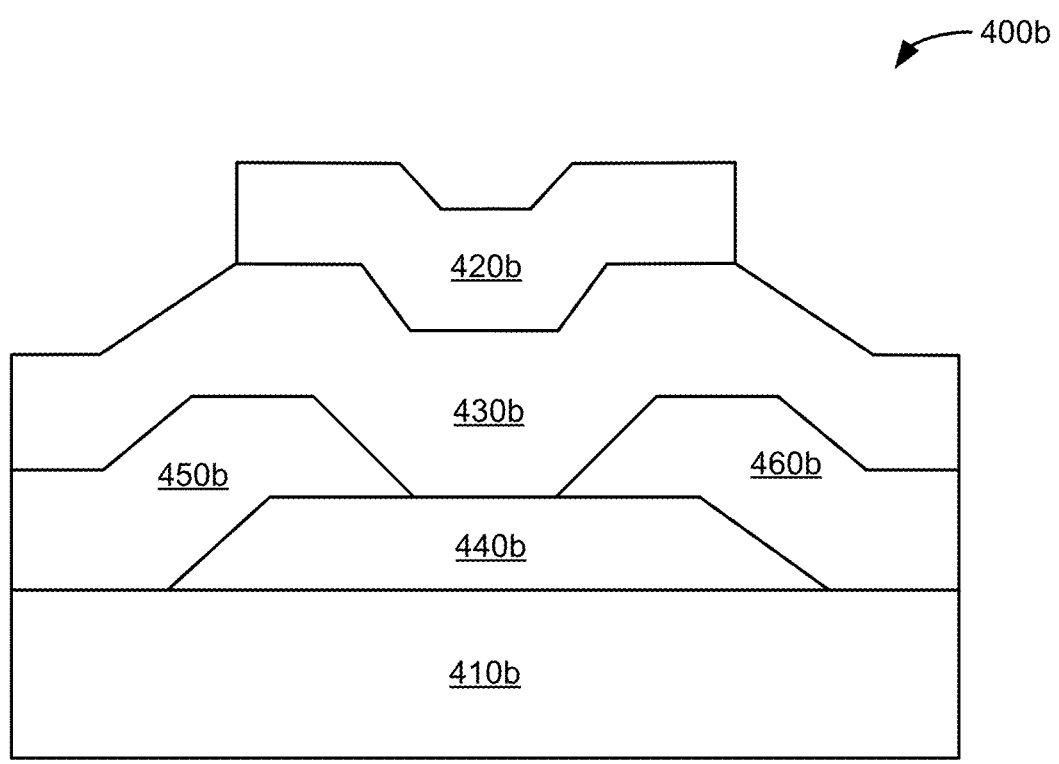
FIG. 4B is an example of a cross-sectional diagram illustrating a top gate TFT according to some implementations.

FIG. 4B is an example of a cross-sectional diagram illustrating a top gate TFT according to some implementations. In FIG. 4B, a top gate TFT 400b includes a substrate 410b, a semiconductor layer 440b over the substrate 410b, a source electrode 450b over a source region of the semiconductor layer 440b, a drain electrode 460b over a drain region of the semiconductor layer 440b, a gate dielectric 430b over the source electrode 450b, and a gate electrode 420b over the gate dielectric 430b, where a channel region is between the source region and the drain region of the semiconductor layer 440b. The semiconductor layer 440b electrically connects the source electrode 450b and the drain electrode 460b, with conductivity in the channel that can be modeled as a function of the potential applied across the gate electrode 420b and the source electrode 450b.

The gate electrodes 420a and 420b may include one or more metals or other conductive materials. Examples of metals include aluminum (Al), copper (Cu), molybdenum (Mo), tantalum (Ta), chromium (Cr), neodymium (Nd), tungsten (W), titanium (Ti), gold (Au), nickel (Ni), and alloys containing any of these elements. In some implementations, each of the gate electrodes 420a and 420b can include two or more layers of different metals arranged in a stacked structure. In some implementations, each of the gate electrodes 420 can have a thickness between about 50 nm and about 500 nm, or between about 100 nm and about 250 nm.

The source electrodes 450a and 450b and the drain electrodes 460a and 460b may include any number of different metals or other conductive materials. Examples of metals include Mo, W, Au, Pt, Ag, Mg, Mn, Ti, Al, Cu, Ta, Cr, Nd, Ni, and alloys containing any of these elements. For example, the source electrodes 450a and 450b and the drain electrodes 460a and 460b may include a stable contact metal such as Mo, W, Au, Pt, and Ag. In some implementations, each of the source electrodes 450a and 450b and the drain electrodes 460a and 460b includes two or more sub-layers of different metals arranged in a stacked structure. In some implementations, each of the source electrodes 450a and 450b and the drain electrodes 460a and 460b can have a thickness between about 50 nm and about 500 nm, or between about 100 nm and about 250 nm.

The gate dielectrics 430a and 430b may also be referred to as gate insulators. Each of the gate dielectrics 430a and 430b may include any number of different dielectric materials, including silicon dioxide ($SiO_2$), aluminum oxide ($Al_2O_3$), hafnium oxide ($HfO_2$), yttrium oxide ($Y_2O_3$), titanium oxide ($TiO_2$), silicon oxynitride (SiON), silicon nitride (SiN), or organic dielectric materials. In some implementations, each of the gate dielectrics 430a and 430b can include two or more layers of dielectric materials arranged in a stacked structure. In some implementations, a thickness of a gate dielectric layer can be between about 50 nm and about 500 nm, or between about 100 nm and about 250 nm.

In FIGS. 4A and 4B, the bottom gate TFT 400a and the top gate TFT 400b can include metal oxide TFTs, where the semiconductor layers 440a and 440b can include a metal oxide. In a metal oxide TFTs, metal oxide semiconductor is deposited as an active channel layer in the TFT. A metal oxide TFT can have high mobility. According to various implementations, the metal oxide TFT is a p-type metal oxide TFT, where the semiconductor layers 440a and 440b can include a p-type metal oxide.

Most oxide semiconductors are n-type semiconductors, with few materials exhibiting p-type conduction. The p-type oxide semiconductors that are known are generally not suited for TFTs due to their high defect densities. However, the ability to form p-type, as well as n-type, oxide semiconductors TFTs allows CMOS TFT circuits to be made, for example.

Many p-type semiconducting oxides are of interest as transparent conducting oxides (TCOs). However, p-type oxide semiconductors that may be used for TCO's do not necessarily have good TFT performance. For optical properties, the direct bandgap of a metal oxide semiconductor is important, while for electronic properties, the indirect bandgap is important. Moreover, while various metal oxide materials may be useful as transparent conducting oxides, they typically are not of high enough quality for TFTs. This is due to the presence of defects in the bandgap. While such defects may not affect TCOs that exhibit metal-like conductivity in the conduction band, they can greatly compromise TFT performance.

Some of the implementations described herein relate to Sn-based p-type oxide semiconductor materials, as well as TFTs including channels having the Sn-based p-type oxide semiconductors, and methods of fabrication. The Sn-based oxide semiconductors disclosed herein include p-type ternary and higher order oxides that include Sn (II) cations and one or more additional metals.

Tin (II) oxide (also known as stannous oxide or tin monoxide; SnO) is a promising p-type metal oxide semiconductor due to its relatively high carrier mobility. Tin (IV) (also known as stannic oxide or tin dioxide; $SnO_2$) is an n-type material, by contrast. (It should be noted that in certain references, there is a tendency to refer to a metal oxide omitting the ratios of the constituent ions or atoms. For example, indium gallium zinc oxide (IGZO) films are commonly referred to as InGaZnO, though the ratio of ions may not be 1:1:1:1. Similarly, tin (IV) oxide ($SnO_2$) may be referred to as SnO in this shorthand manner. As used herein, however, SnO refers to stannous oxide while $SnO_2$ refers to stannic oxide.)

While the description below refers chiefly to ternary oxides, quaternary and higher order oxides are also provided. The ternary oxides described herein may be referred to as Sn-M-O, where Sn refers to tin (II) and M is a different (i.e., non-tin) metal. In some implementations, M is selected from the d block or the p block of the periodic table. As used herein, the term metal includes metalloids such as silicon (Si).

In some implementations, M is selected from Groups 3 and 4 of the periodic table, or is one of tungsten (W), boron (B), niobium (Nb), aluminum (Al), gallium (Ga), or silicon (Si). Group 3 metals include scandium (Sc) and yttrium (Y). Group 4 metals include titanium (Ti), zirconium (Zr) and hafnium (Hf).

Quaternary oxides described herein may be referred to as $Sn-M_1-M_2-O$, where Sn refers to tin (II) and $M_1$ and $M_2$ are different metals (i.e., $M_1$ is a non-tin metal that is not $M_2$). In some implementations, one or both of $M_1$ and $M_2$ is selected from Groups 3 and 4 of the periodic table, or is one of W, B, Nb, Al, Ga, or Si. Group 3 metals include scandium (Sc) and yttrium (Y). Group 4 metals include titanium (Ti), zirconium (Zr) and hafnium (Hf). Similarly, quinary Sn-based p-type oxide semiconductors can include three or more metals, one of which is Sn (II).

Examples of Sn-M-O p-type semiconductors include Sn—W—O, Sn—Ti—O, Sn—B—O, Sn—Nb—O, Sn—Al—O, Sn—Ga—O, Sn—Sc—O, Sn—Y—O, Sn—Zr—O and Sn—Hf—O. While the examples presented above are characterized as ternary, quaternary or higher order compounds, the p-type semiconductor oxides may also be characterized as combinations of binary oxides. For example, a Sn-M-O oxide may also be characterized as a combination of Sn—O binary oxide and an M-O binary oxide. As such, the Sn-based p-type semiconductor may be a combination of SnO and two or more different metal oxides. According to various implementations, the Sn-based p-type oxide semiconductors may or may not be isovalent.

The metals in the tin-based p-type metal oxide semiconductors may have various oxidation states, or a combination of oxidation states. The oxidation state may depend on the state of the material, with amorphous materials having a wider range of permissible oxidation states that exhibit p-type conduction. The Sn-based p-type oxide semiconductors described herein may be ionic or have a mixed ionic and covalent character, depending in part on their constituent elements.

The relative ratios of the metals in the Sn-based p-type oxide semiconductors disclosed herein may vary with Sn (II) being at least about 10% of the total molar amount of the metals in the p-type oxide semiconductor. For example, Sn-M-O may be characterized as $Sn_{(x)}M_{(1-x)}O_z$, with x being at least 0.3 and z being a non-zero number that depends on the particular metal employed. Similarly, $Sn-M_1-M_2-O$ may be characterized as $Sn_{(x)}M_{1(y1=1-x-y2)}M_{2(y2=1-x-y1)}O_z$, with x being at least 0.3 and z being a non-zero number that depends on the particular metals employed.

The compositional ranges disclosed herein are for ternary or higher order compounds. The amount of minor components (e.g., M, $M_1$, $M_2$, or Sn (II)), is larger than that of a dopant. However, Sn-based p-type oxides disclosed herein can be doped or undoped. Examples of dopants can include hydrogen and metals. A dopant is present at much lower levels than a metal cation constituent of a ternary or higher order metal oxide compound. For example, in a p-type metal oxide film having the formula $A_xB_yO$, B may be considered a dopant if y is less than 0.05. A dopant may also be characterized as being less than 1% (atomic) of a thin film.

Tin (II) oxide is a promising p-type metal oxide semiconductor due to its relatively high hole mobility of over 1 $cm^2V\cdot s$. Mobility characterizes how a carrier (hole or electron) moves through a semiconductor in the presence of an electric field, and is defined as $\mu=v_d/E$, where $v_d$ is the drift velocity of the electrons and E is the electric field. Mobility may be determined by Hall effect measurements (and reported as Hall mobility) or extracted from TFT performance measurements (and reported as field effect mobility). For example, the carrier mobility may be extracted from experimental measurements of the drain current ($I_d$) and gate bias ($V_g$). Field effect mobility can be determined from saturation-mode or linear-region measurements.

Figure 5:
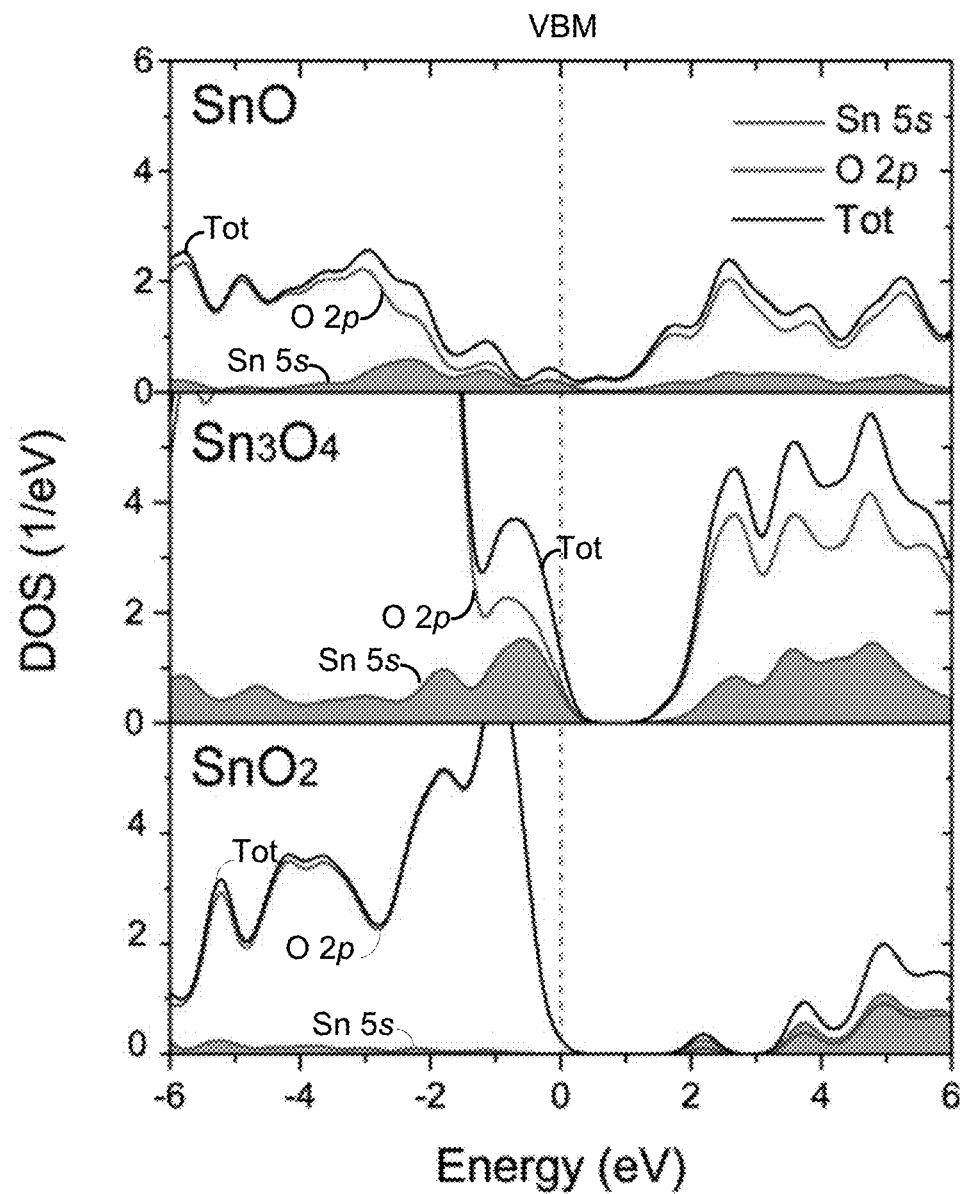
FIG. 5 shows a partial density of states (DOS) for SnO and $SnO_2$ as well as for the mixed valence (Sn (II) and Sn (IV)) oxide $Sn_3O_4$.

FIG. 5 shows a partial density of states (DOS) for SnO and $SnO_2$ as well as for the mixed valence (Sn (II) and Sn (IV)) oxide $Sn_3O_4$. The partial DOS provides a qualitative picture of the electronic structures of the materials and provides insight to the experimentally observed high mobility of SnO. The valence band of SnO is formed by hybridized orbitals of O 2p and Sn 5s. As shown in FIG. 5, at the valence band maximum (VBM; at 0 eV), there is substantial overlap of the spherical Sn 5s orbital with the O 2p orbitals. It is believed that the experimentally observed high hole mobility of SnO is due to the spherical Sn 5s orbital providing the main carrier pathway, with significant overlap with the O 2p orbital. By contrast, at the VBM, the O 2p orbital dominates for $SnO_2$, with no Sn 5s contribution or overlap. As such, the $SnO_2$ is an n-type conductor. The mixed valence $Sn_3O_4$ oxide also shows overlap of the Sn 5s orbital with the O 2p orbital; however, fabrication of the mixed valence $Sn_3O_4$ can be difficult.

In addition to mobility, a semiconductor material may be characterized by bandgap and crystallization. SnO, for example, has an indirect bandgap of 0.8 eV and a crystallization temperature of about 300° C.

In some implementations, the ternary and higher order Sn-based p-type oxide compounds provided herein may be characterized by having contributions from spherical orbitals to the VBM, which results in high hole mobility. In some implementations, the Sn-based p-type oxides have larger bandgaps than SnO. In some implementations, the Sn-based p-type oxides have higher crystallization temperatures than SnO.

The Sn-based p-type oxide semiconductors can be implemented in p-type TFTs. In addition to carrier mobility, a TFT may also be characterized by threshold voltage ($V_{th}$), which is the minimum gate-to-source voltage differential that creates a conducting path between the source and drain; on/off current ratio; and subthreshold slope, which is a measure of the switching behavior of the TFT. Furthermore, a TFT may be characterized by its off-current. Off-current refers to the leakage current with gate electrode below the threshold voltage. Leakage current can lead to reduced performance characteristics; for example, leakage current in a display device TFT may manifest in a change in pixel brightness, an increase in noise, and a reduction in the grayscale shades. According to various implementations, TFT characteristics including high mobility and low off-currents may be provided.

Figure 6:
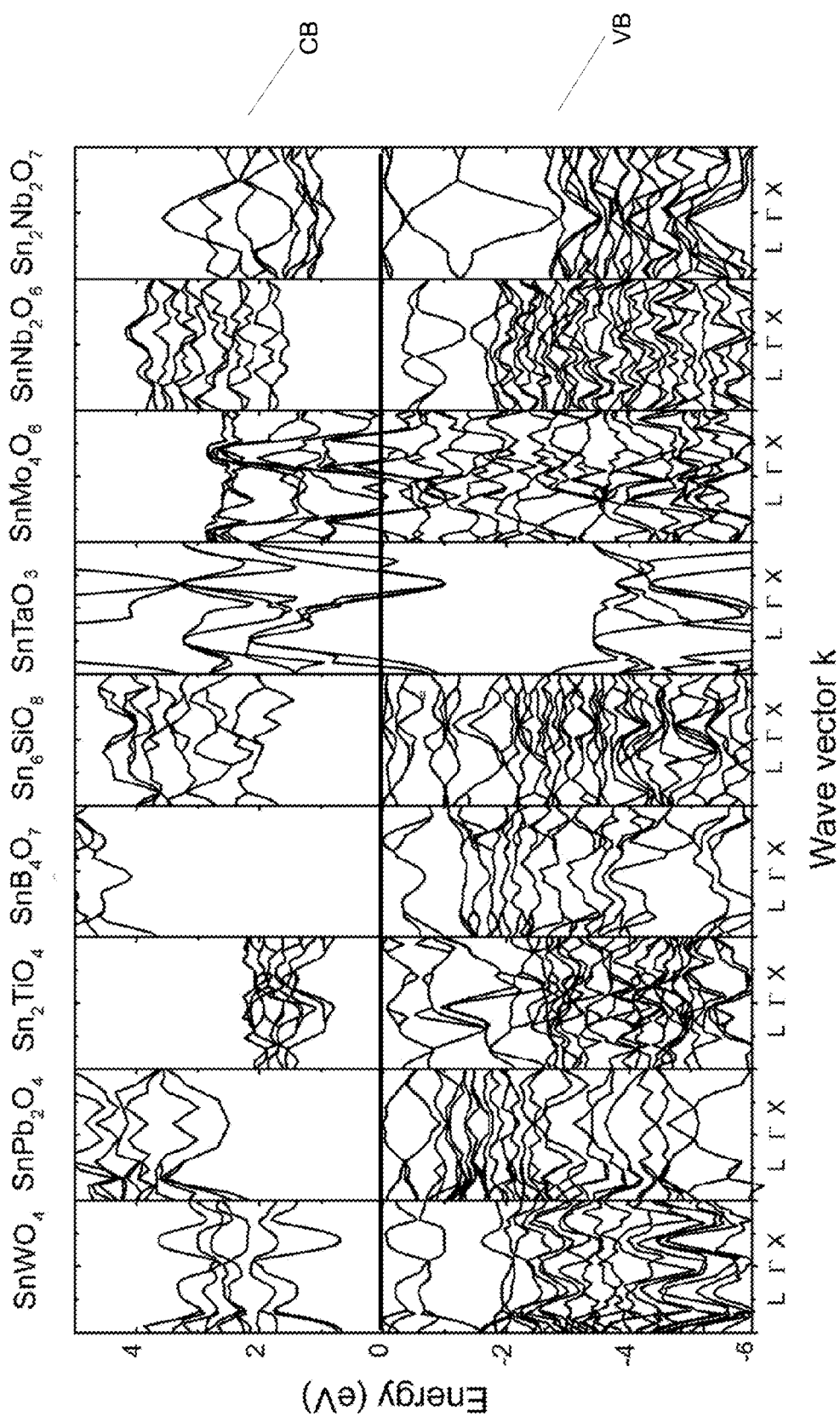
FIG. 6 provides band structure plots determined from density-function theory (DFT) calculations for various Sn (II)-based ternary oxides.

FIG. 6 provides pseudo band diagram determined from density-function theory (DFT) calculations for various Sn (II)-based ternary oxides. A band structure plot shows the variation of the energy E with the wave vector κ. While DFT band structure plots may be associated with systematic errors that can lead to inaccurate quantitative bandgap determinations, the band structure plots in FIG. 6 provide a qualitative assessment of potential Sn-based p-type oxide semiconductors described herein. The following characteristics may be assessed: the existence of a gap between the valence band (VB) and the conduction band (CB) as well as the shape of the band structures. The existence of a gap between the VB and CB indicates that the ternary Sn (II)-based oxide is a p-type material. The shapes of the plots at the valence band maximum (VBM) provide information about mobility. This is because the effective mass of a hole is inversely proportional to the VBM curvature, with a large curvature indicating a smaller effective mass and higher mobility than a small curvature.

Of $SnWO_4$, $SnPb_2O_4$, $Sn_2TiO_4$, $SnB_4O_7$, $Sn_6SiO_8$, $SnTaO_3$, $SnMo_4O_6$, $SnNb_2O_6$, $Sn_2Nb_2O_7$, the plots for $SnTaO_3$ and $SnMo_4O_6$ indicate that these ternary oxides do not exhibit p-type conductivity. For $SnMo_4O_6$, this is apparent from the lack of any bandgap, indicating that the material is a conductor, rather than a semiconductor. For $SnTaO_3$, the band structure plot indicates that the ternary oxide is an n-type semiconductor, with the Fermi level located above the conduction band minimum (CBM).

The remaining plots indicate that W, Ti, Nb, B, Pb and Si may all be constituents of Sn-based p-type oxide semiconductors disclosed herein. Turning first to $SnWO_4$, a bandgap is observed with reasonably large band dispersion. This is also the case for $Sn_2TiO_4$ and $SnB_4O_7$. This indicates that Sn-M-O oxides where M is W, Ti or B are good p-type metal oxide semiconductors. As discussed further below, while the bandgap for $SnB_4O_7$ is relatively wide, it may be reduced by modulating the B content in the oxide.

$Sn_6SiO_8$ also has a bandgap with reasonably large band dispersion. The plots for $SnNb_2O_6$ and $Sn_2Nb_2O_7$ indicate p-type conduction, though the relatively small curvature at the VBM may indicate less mobility. Similarly, the $SnPb_2O_4$ plot demonstrates p-type conduction with a relatively small band dispersion. These results indicate that Sn-M-O oxides where M is Nb, Pb and Si may also be useful p-type semiconductors.

Figure 7:
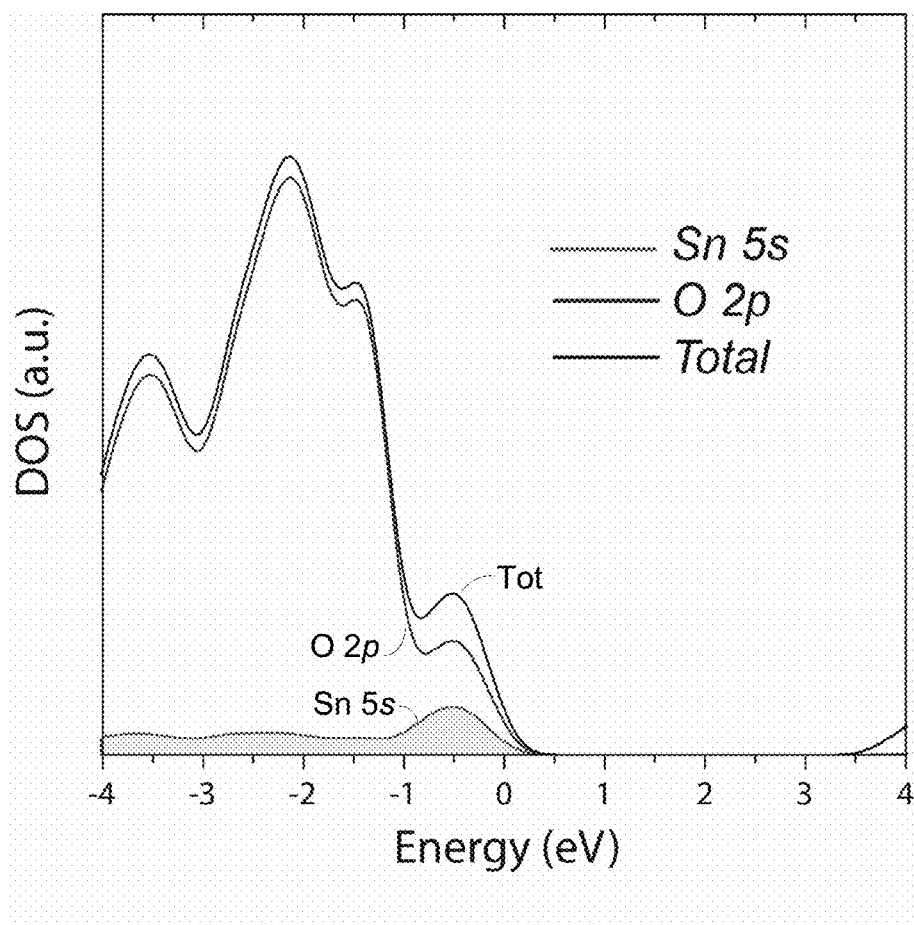
FIG. 7 shows a partial DOS of a Sn—B—O oxide.

As discussed above with respect to FIG. 5, the Sn 5s orbital contributes to the VBM of SnO. According to various implementations, the Sn-based p-type oxides include Sn 5s orbital contributions to the VBM of the oxides. FIG. 7 shows a partial DOS of a Sn—B—O oxide. As can be seen from FIG. 7, the Sn 5s orbital contributes to the VBM. This is atypical for oxide semiconductors for which there is usually no such s orbital contribution and indicates that the Sn—B—O oxide is a p-type oxide semiconductor.

The relative ratios of the constituents of the ternary oxide compounds may vary and are not limited to the examples in FIG. 6. In some implementations, the relative amount of M in a Sn-M-O compound may be adjusted to change the bandgap. Referring to the $SnB_4O_7$ band structure plot in FIG. 6, for example, the bandgap is relatively wide. While wide bandgaps semiconductors can decrease the off-current, mobility can be compromised. The relative amount of B in the Sn—B—O p-type oxide may be reduced to narrow the bandgap. Similarly, the relative amount of M in any Sn-M-O oxide may be modulated to provide a wider bandgap.

For a $Sn_{(x)}M_{(1-x)}O_z$ oxide, x may be at least 0.2 in some implementations. In some implementations, x may range from about 0.2 to 0.95. In some implementations, x may be at least 0.3. Still further, in some implementations, x may range from 0.3 to 0.9. In some implementations, in which M is B, x may range from about 0.7 to 0.9. In some implementations, the ratio of Sn:M (atomic) may be between about 0.1 and 9.5, or between about 0.2 and 5, or between about 1 and 5, or between about 2 and 5.

For a $Sn_{(x)}M_{1(y1=1-x-y2)}M_{2(y2=1-x-y1)}O_z$ oxide, x may be at least 0.2 in some implementations. In some implementations, x may range from about 0.2 to 0.95. In some implementations, x may be at least 0.3. Still further, in some implementations, x may range from 0.3 to 0.9. In some implementations, the ratio of Sn:($M_1+M_2$) (atomic) may be between about 0.1 and 9.5, or between about 0.2 and 5, or between about 1 and 5, or between about 2 and 5.

Figure 8:
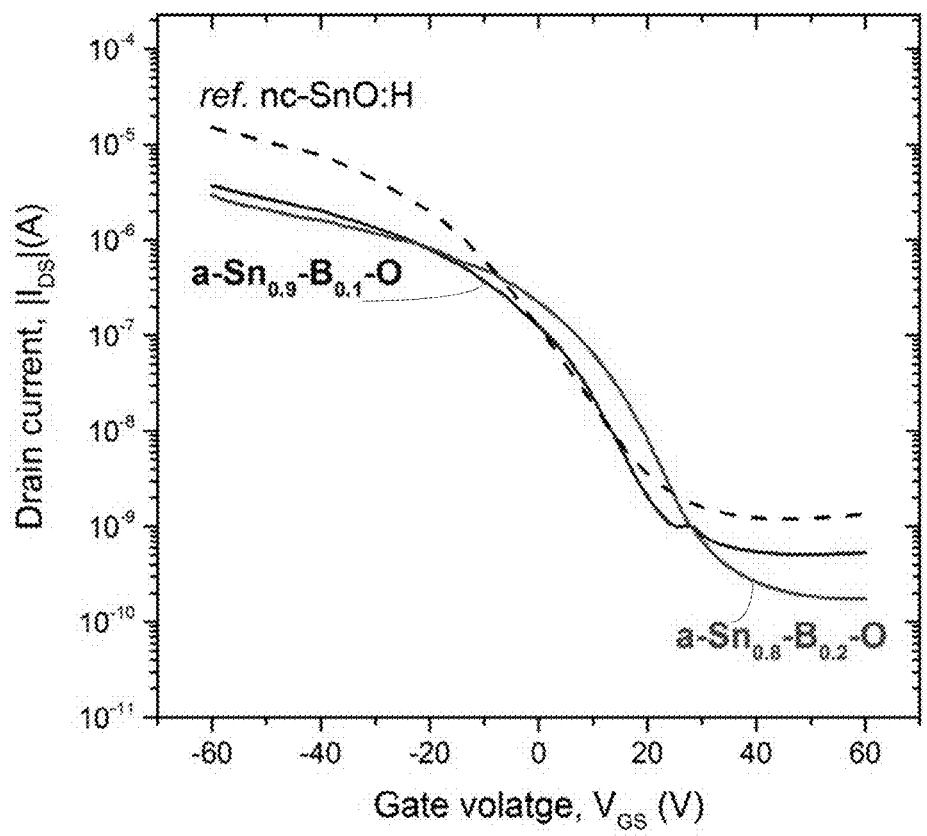
FIG. 8 shows drain-source current ($I_{DS}$) as function of gate-source voltage ($V_{GS}$) for TFTs having p-channels of the ternary Sn-based p-type oxides a-$Sn_{0.8}$—$B_{0.2}$O and a-$Sn_{0.9}$—$B_{0.1}$O as compared to a TFT having a p-channel of the binary oxide nc-SnO:H.

As noted above, in some implementations, the Sn-based p-type oxide semiconductors can be implemented in a TFT having a relatively low off-current. FIG. 8 shows drain-source current ($I_{DS}$) as function of gate-source voltage ($V_{GS}$) for TFTs having p-channels of the ternary Sn-based p-type oxides a-$Sn_{0.8}$—$B_{0.2}$O and a-$Sn_{0.9}$—$B_{0.1}$O as compared to a TFT having a p-channel of the binary oxide nc-SnO:H. Both of the films were deposited by pulsed laser deposition (PLD) using ceramics targets of pure SnO and B-doped SnO at room temperature. The B-doped SnO target was prepared by a standard solid-state reaction method using SnO and $B_2O_3$. After deposition, the films were subjected to thermal annealing at 250° C. for 30 min in a hydrogen-coating atmosphere. As can be seen in FIG. 8, the ternary Sn—B—O oxides TFTs have lower off-currents than the SnO TFT. FIG. 8 also demonstrates that the off-current can be modulated by increasing or decreasing the B content.

According to various implementations, the Sn-based p-type oxide semiconductors disclosed herein may be amorphous or crystalline including single crystalline and polycrystalline materials. In some implementations, polycrystalline materials may exhibit nanocrystallinity. In some implementations, the Sn-based p-type oxide semiconductors disclosed herein have crystallization temperatures higher than that of SnO, which is around 300° C. This can be useful, for example, for fabrication of p-channel TFTs having amorphous oxide channels. As discussed further below, in some implementations, a Sn-based p-type oxide semiconductor is annealed during TFT fabrication, for example, to reduce defects. P-type oxide semiconductor materials having higher crystallization temperatures can allow higher annealing temperatures without crystallization.

Figure 9:
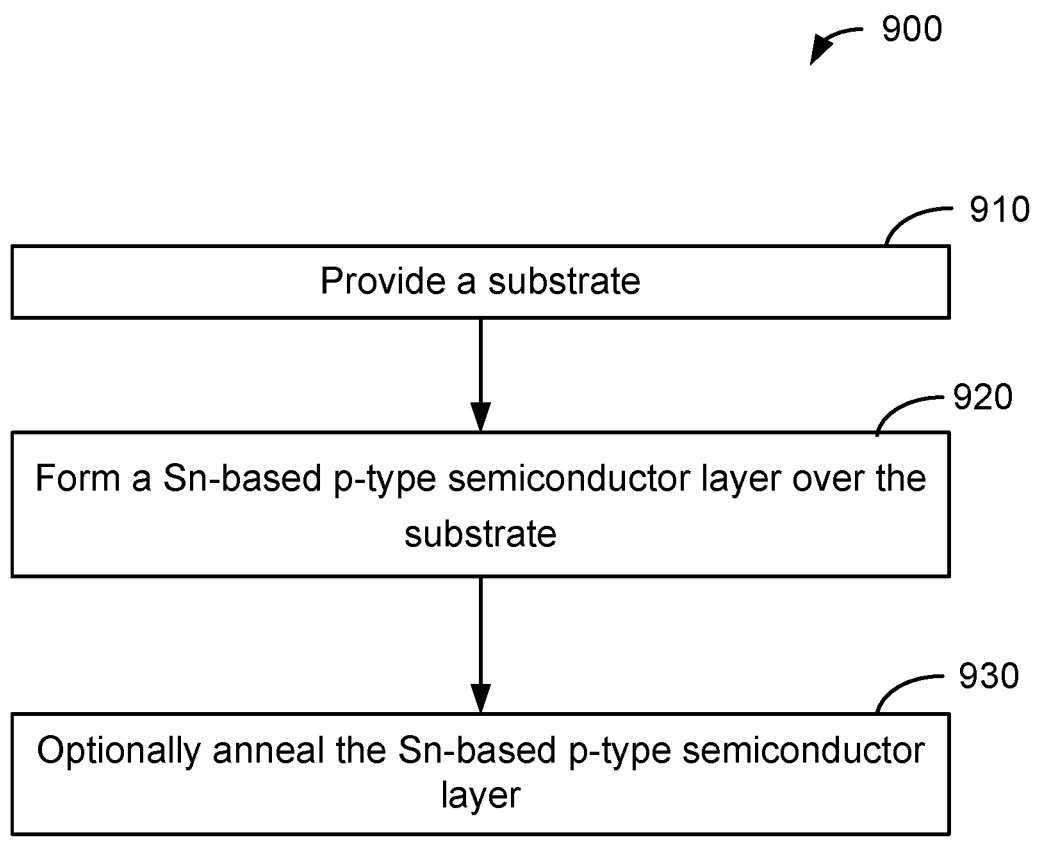
FIG. 9 is a flow diagram illustrating an example of a method of fabricating a Sn-based p-type oxide semiconductor layer according to some implementations.

FIG. 9 is a flow diagram illustrating an example of a method of fabricating a Sn-based p-type oxide semiconductor layer according to some implementations. The process 900 may be performed in different orders and/or with different, fewer or additional operations. In some implementations, the process 900 may be described with reference to one or more processing chambers and a controller, where the controller may be programmed to control any operations described herein.

At block 910 of the process 900, a substrate is provided. The substrate can include any substrate material, including a substantially transparent material, such as glass or plastic. Substantial transparency as used herein can be defined as transmittance of visible light of about 70% or more, such as about 80% or more, or about 90% or more. Glass substrates (sometimes referred to as glass plates or panels) may be or include a borosilicate glass, a soda lime glass, photoglass, quartz, Pyrex®, or other suitable glass material. A non-glass substrate can be used, such as a polycarbonate, acrylic, polyimide, polyethylene terephthalate (PET), or polyether ether ketone (PEEK) substrate. Other suitable substrate materials can include flexible substrate materials. In some implementations, the substrate can have dimensions of a few microns to hundreds of microns.

At block 920 of the process 900, a Sn-based p-type oxide semiconductor layer is formed over the substrate. Examples of p-type metal oxide semiconductors are given above and include Sn—W—O, Sn—Ti—O, Sn—B—O, Sn—Nb—O, Sn—Al—O, Sn—Ga—O, Sn—Sc—O, Sn—Y—O, Sn—Zr—O and Sn—Hf—O, where Sn refers to Sn (II). The Sn-based p-type oxide semiconductor layer can include a channel region aligned or to be aligned with a gate electrode, where the channel region is between a source region and a drain region of the oxide semiconductor layer. In some implementations, the Sn-based p-type oxide semiconductor layer can be between about 10 nm and about 100 nm thick. Block 920 can involve deposition of the Sn-based p-type oxide semiconductor layer by any method appropriate for the material being deposited, including physical vapor deposition (PVD) processes, chemical vapor deposition (CVD) processes, and atomic layer deposition (ALD) processes. PVD processes include thermal evaporation deposition, sputter deposition and pulsed laser deposition (PLD) processes. For example, Sn-M-O may be deposited by sputtering a SnO target and an MO target or sputtering a Sn-M-O target. ALD processes of forming ternary Sn-based p-type oxide semiconductors are discussed further below with reference to FIGS. 10 and 11.

At block 930 of the process 500, the Sn-based p-type oxide semiconductor layer is optionally thermally annealed. The Sn-based p-type oxide semiconductor layer may be annealed in any appropriate atmosphere, such as an oxygen or hydrogen atmosphere. For example, the p-type oxide semiconductor layer may be exposed to a $H_2$-containing process gas at temperatures ranging between about 250° C. and 400° C.

In some implementations, the process can continue with forming one or more dielectric layers or metal layers on the Sn-based p-type oxide semiconductor layer. For example, in some implementations, a dielectric layer, such as an oxide or nitride, is formed over the Sn-based p-type oxide semiconductor layer so that the dielectric layer is contacting the Sn-based p-type oxide semiconductor layer. The dielectric layer may be one of a passivation layer, a gate dielectric layer, and an etch stop layer, for example. The dielectric layer can include any suitable material including oxides, such as $SiO_2$ or $Al_2O_3$, and nitrides. In some implementations, the dielectric layer can be between about 10 nm and about 1000 nm thick, such as between about 300 nm and about 500 nm thick. The Sn-based p-type oxide semiconductor layer and the dielectric layer can form part of a TFT.

In some implementations, the process 900 further includes forming a source electrode on the source region of the Sn-based p-type oxide semiconductor layer and forming a drain electrode on the drain region of the Sn-based p-type oxide semiconductor layer. To form the source electrode and the drain electrode, the source electrode and the drain electrode may be etched. Thus, the process 900 may further include etching the source electrode and the drain electrode to expose the channel region of the Sn-based p-type oxide semiconductor layer. In some implementations, forming the dielectric layer occurs before forming the source electrode and the drain electrode. This can include instances where the dielectric layer is an etch stop layer or a gate dielectric. In some implementations, forming the dielectric layer can occur after forming the source electrode and the drain electrode. This can include instances where the dielectric layer is a passivation layer formed over the source electrode and the drain electrode to protect the TFT.

In some implementations, the process 900 further includes forming a gate electrode over the substrate. In some implementations, the gate electrode may be formed on the substrate, and a gate dielectric may be formed on the gate electrode for a bottom gate TFT. In some implementations, the dielectric oxide layer may serve as the gate dielectric, and the gate electrode may be formed over the gate dielectric for a top gate TFT.

In some implementations, block 920 of the process 900 involves ALD deposition of a Sn-based p-type oxide semiconductor layer. ALD processes may use surface-mediated deposition reactions to deposit films on a layer-by-layer basis. A first reactant can be directed over the substrate, with at least some of the first reactant chemisorbing or physisorbing onto the surface of the substrate to form a layer. The layer may be, though is not necessarily, a monolayer or sub-monolayer of the adsorbed reactant molecule. Deposition may be self-limited such that once a saturated layer is deposited, the reactant does not continue to adsorb on the surface. In some implementations, an ALD process may be performed in a sub-saturated regime. In such processes, one or more of the reactants may be limited such that a sub-saturated adsorbed layer is formed on the substrate surface.

For deposition of Sn-based p-type oxides, reactants that may be used include tin (II)-based organic precursors such as bis[bis(trimethylsilyl)amino]tin (II), tin(II) acetylacetonate, and tin (II) 2,4-pentanedionate. Syntheses of examples of N-heterocyclic stannylene compounds such as bis(N,N'-diisopropylacetamidinato)tin (II) and tin (II) amidinates (rac-1,3-di-tert-butyl-4,5-dimethyl-1,3-diaza-2-stannacyclopentane-2-ylidene that also may be used are described in Sang Bok Kim et al., Chem. Mater. 2014, 26, 3065-3073.

Examples of titanium precursors that may be used in ALD deposition of Sn—Ti—O oxides include organotitanium compounds such as tetrakis(diethylamido)titanium(IV), bis (tert-butylcyclopentadienyl)titanium(IV) dichloride, and titanium(IV) diisopropoxidebis(2,2,6,6-tetrame1'yl-3,5-heptanedionate), tetraethoxytitanium, tetramethoxytitanium, and tetraizopropoxytitanium. Examples of tungsten precursors that may be used in ALD deposition of Sn—W—O oxides include tungsten hexafluoride, tungsten hexachloride, and tungsten hexacarbonyl. In some embodiments, organotungsten compounds such as tungsten bis(alkylimino)bis (alkylamino) compounds (e.g., bis(tert-butylimino)bis(dimethylamino)tungsten(VI) and hexakis(dimethylamino) tungsten(VI)) may be used. Examples of boron precursors that may be used in ALD deposition of Sn—B—O oxides include boron tribromide and boranes including borane ($BH_3$), diborane ($B_2H_6$), triborane ($B_3H_7$). Examples of niobium precursors that may be used in ALD deposition of Sn—Nb—O oxides include organoniobium compounds such as niobium(V) ethoxide and tris(diethylamido)(tert-butylimido)niobium(V).

Other compounds that may be incorporated into ALD deposited Sn-based films can include Hf, Si, Al, Ga, Sc, Y, and Zr. Any precursor appropriate for ALD deposition may be used in such implementations.

Examples of oxidants that may be employed include oxygen ($O_2$), ozone ($O_3$), water ($H_2O$), hydrogen peroxide ($H_2O_2$) and combinations thereof. In some implementations, a hydrogen-containing oxidant such as water or hydrogen peroxide is employed. Such an oxidant may be, in some implementations, a hydrogen source for the deposited layer.

In some implementations, depositing a Sn-based p-type oxide semiconductor layer involves controlling temperature such that a p-type oxide semiconductor, rather than an n-type metal oxide semiconductor or an oxide insulator, is formed during deposition. In some implementations, a relatively weak oxidant may be employed (either alone or as a diluent of a stronger oxidant) to facilitate formation of a p-type semiconductor. Examples of weak oxidants include water, carbon dioxide ($CO_2$), carbon monoxide (CO), methanol ($CH_3OH$), ethanol ($C_2H_6OH$), isopropyl alcohol ($C_3H_7OH$) and combinations thereof.

In some implementations, plasma energy may be applied during one or more of the reactant pulses. For example, a cycle may include the following sequence: metal reactants (plasma off)/purge/oxidant (plasma on)/purge. In some implementations, plasma may be applied during a hydrogen-containing oxidant to facilitate hydrogen incorporation into the film. In some implementations, a relatively low temperature (e.g., below about 300° C., below about 250° C., or below about 200° C.) during ALD deposition of the p-type metal oxide thin film, with plasma energy applied during oxidant pulses.

Figure 10:
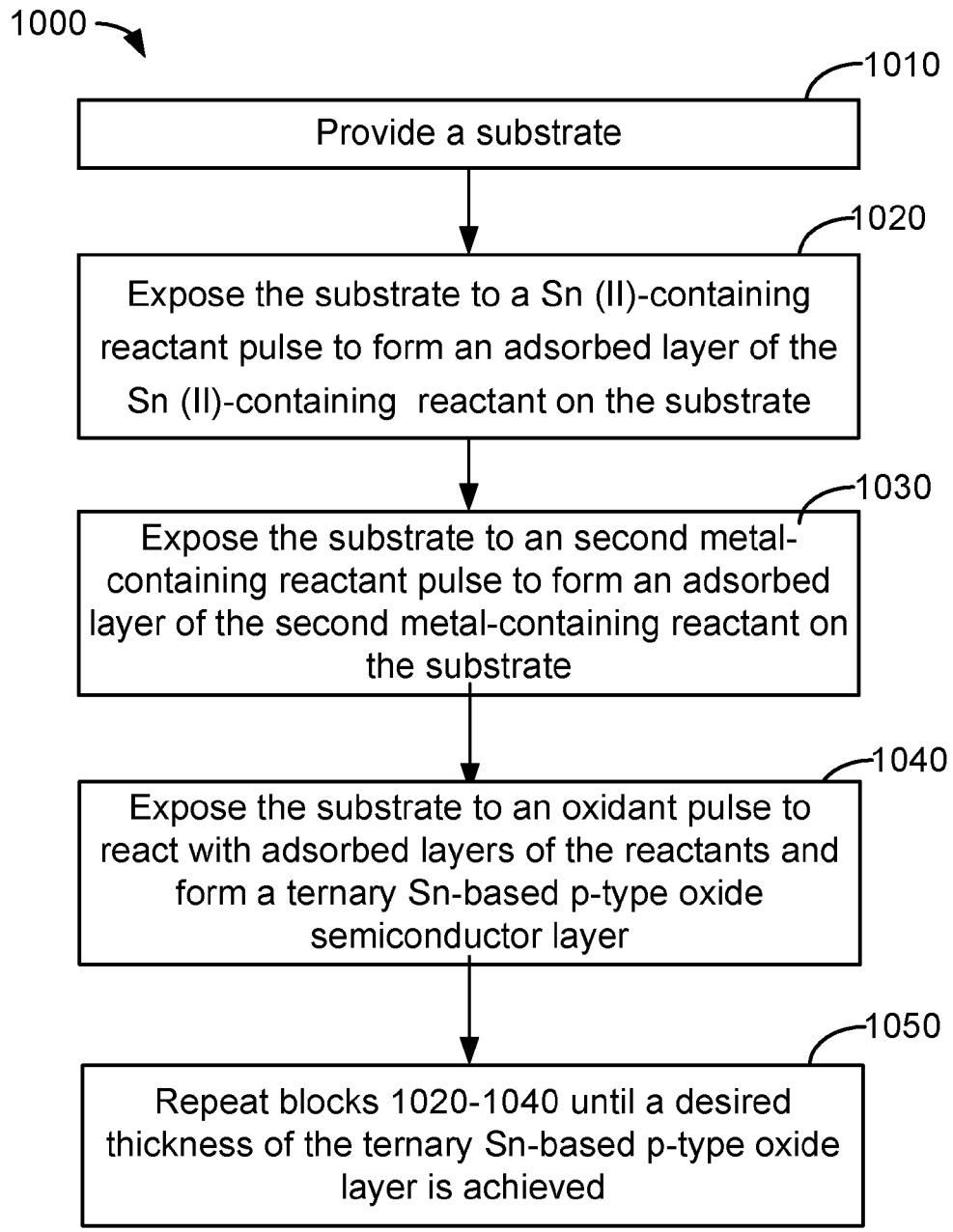
FIGS. 10 and 11 are flow diagrams illustrating examples of atomic layer deposition (ALD) methods of fabricating ternary Sn-based p-type oxide semiconductor layers according to some implementations.
Figure 11:
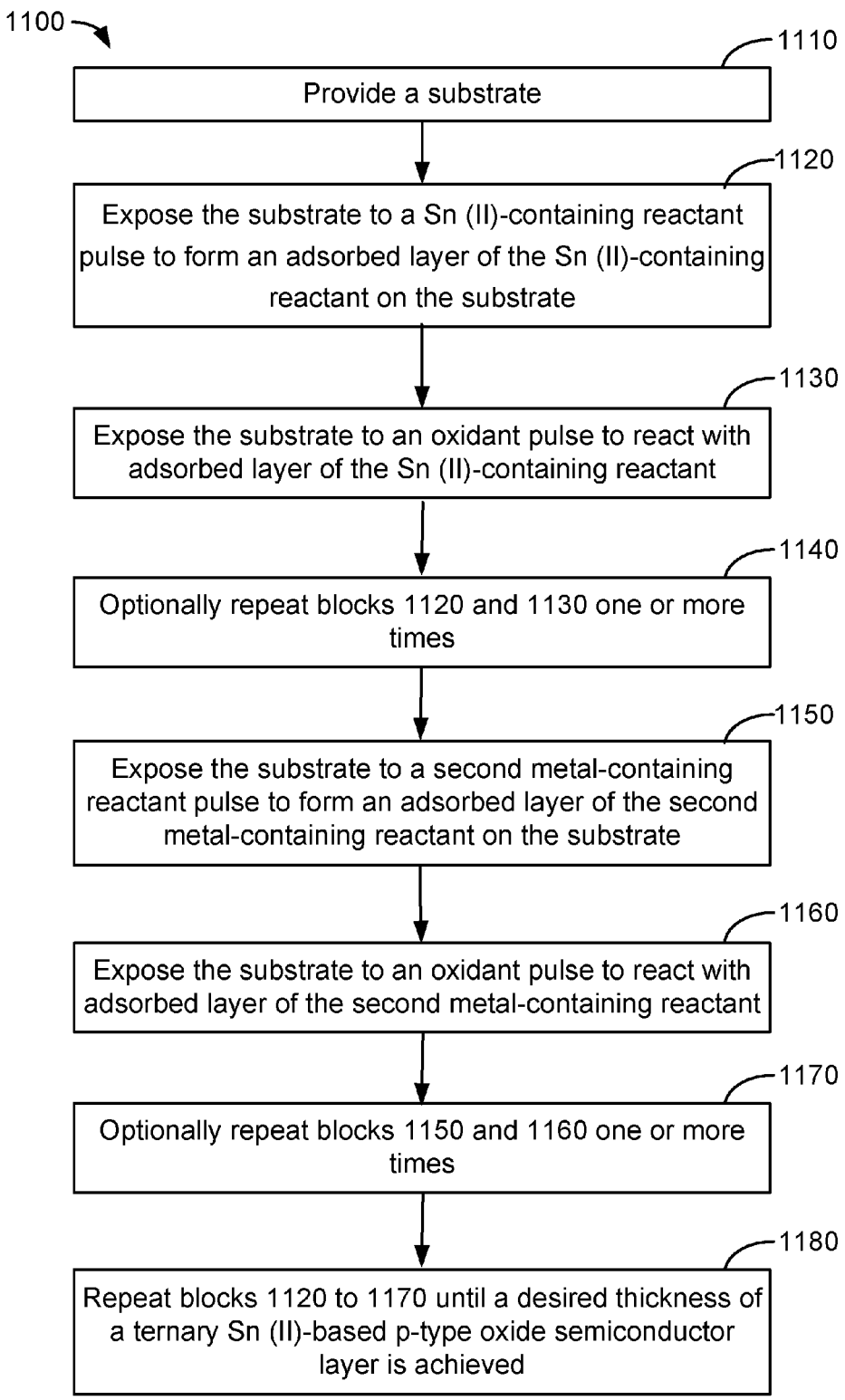

Various reactant pulse sequences may be employed to deposit ternary or higher order Sn-based p-type oxide semiconductor layers by ALD. FIGS. 10 and 11 are flow diagrams illustrating examples of ALD methods of fabricating ternary Sn-based p-type oxide semiconductor layers according to some implementations. It will be understood that the methods disclosed in FIGS. 10 and 11 may be extended to deposit quaternary or higher order Sn-based p-type oxide semiconductor layers.

Turning first to FIG. 10, at block 1010 of the process 1000, a substrate is provided. The substrate can include any substrate material as discussed above with respect to block 910 of FIG. 9. At block 1020 of the process 1000, the substrate is exposed to a pulse of a Sn(II)-containing reactant to form an adsorbed layer of the reactant on the substrate.

At block 1030 of the process 1000, the substrate including the adsorbed layer of the Sn(II)-containing reactant is exposed to a second metal-containing reactant pulse to form an adsorbed layer of the second metal-containing reactant. Examples of second metal-containing reactants include W, Ti, Nb or B reactant, with other examples given above.

At block 1040 of the process 1000, the substrate is exposed to an oxidant pulse to react with the adsorbed layers of the reactants and form a ternary Sn-based p-type oxide semiconductor layer. At block 1050 of the process, blocks 1020 to 1040 are repeated until a desired thickness of the ternary Sn-based p-type oxide semiconductor layer is achieved.

In some implementations, blocks 1020 and 1030 may be performed such that the Sn (II)-containing reactant the second metal-containing reactants are introduced at the same time, forming an adsorbed layer including both of these reactants.

In FIG. 11, at block 1110 of the process 1100 a substrate is provided as described above with respect to FIGS. 9 and 10. At block 1120 of the process 1100, the substrate is exposed to a Sn(II)-containing reactant pulse to form an adsorbed layer of the Sn (II)-containing reactant on the substrate. Examples of Sn (II)-containing reactants are given above. At block 1130 of the process 1100, the substrate is exposed to an oxidant pulse to react with the adsorbed layer of the Sn(II)-containing reactant. At block 1140 of the process, blocks 1120 and 1130 are optionally repeated one or more times. At block 1150 of the process 1100, the substrate is exposed to a second metal-containing reactant pulse to form an adsorbed layer of the second metal-containing reactant. Examples of second metal-containing reactants include W, Ti, Nb or B reactant, with other examples given above. At block 1160 of the process 1100, the substrate is exposed to an oxidant pulse to react with the adsorbed layer of the second metal-containing reactant and form a ternary Sn-based p-type oxide semiconductor layer. At block 1170 of the process 1100, blocks 1150 and 1160 are optionally repeated one or more times. At block 1180 of the process 1100, blocks 1120 to 1170 are repeated until the desired thickness of the ternary Sn-based p-type oxide semiconductor layer is achieved.

According to various implementations, the relative ratios of the Sn (II)-containing reactant and second metal-containing reactants may be controlled by varying flow rates, dose times, or concentrations of the reactant pulses, as well as the number of cycles that include each of these pulses.

Figure 12:
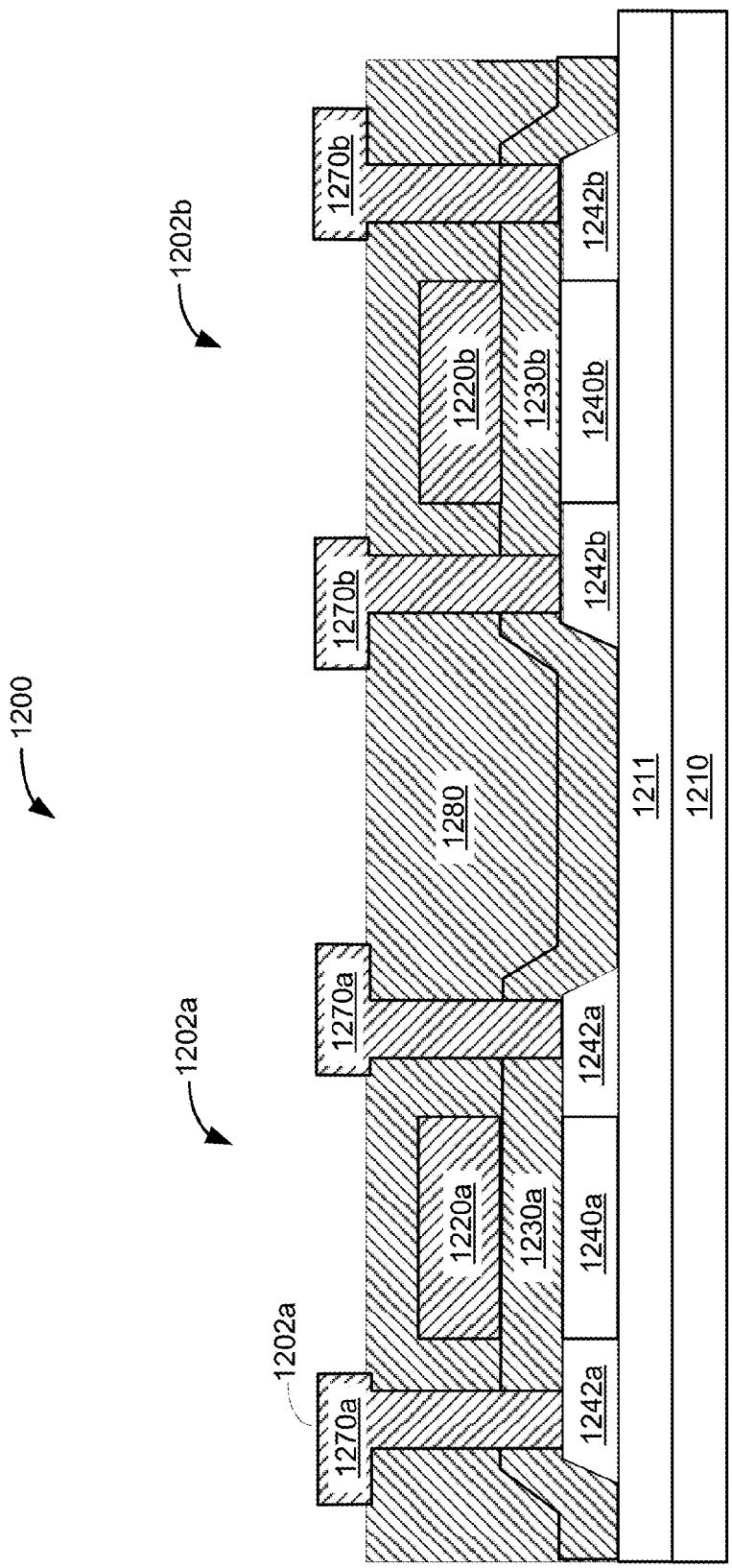
FIG. 12 is an example of a cross-sectional diagram illustrating a complementary metal-oxide-semiconductor (CMOS) TFT device according to some implementations.

In some implementations, a Sn-based p-type oxide semiconductor layer as disclosed above may form part of a CMOS TFT device including a p-type TFT and an n-type TFT. FIG. 12 is an example of a cross-sectional diagram illustrating a CMOS TFT device according to some implementations. In FIG. 12, a CMOS TFT device 1200 includes a p-type top gate TFT 1202*a* and an n-type top gate TFT 1202*b* on a substrate 1210. Examples of substrates are described above. In the example of FIG. 12, the p-type top gate TFT 1202*a* and the n-type top gate TFT 1202*b* are formed on a dielectric layer 1211; in some implementations, however, they may be formed on the substrate 1210 as in the example of FIG. 4B.

The p-type top gate TFT 1202*a* includes a ternary or higher order Sn-based p-type oxide semiconductor layer including a channel region 1240*a* and source and drain regions 1242*a*. Source and drain electrodes 1270*a* contact the source and drain regions 1242*a* of the Sn-based p-type oxide semiconductor layer, and a gate electrode 1220*a* overlies a gate dielectric 1230*a*. The Sn-based p-type oxide semiconductor layer of the p-type TFT 1202*a* may include any of the Sn-based p-type oxides discussed above.

The n-type top gate TFT 1202*b* includes an n-type metal oxide semiconductor layer including a channel region 1240*b* and source and drain regions 1242*b*. Source and drain electrodes 1270*b* contact the source and drain regions 1242*b* of the n-type metal oxide layer, and a gate electrode 1220*b* overlies a gate dielectric 1230*b*. The source and drain electrodes 1270*a* and 1270*b* may be formed in a dielectric layer 1280, which separates the p-type top gate TFT 1202*a* and the n-type top gate TFT 1202*b*.

In some implementations, the n-type metal oxide semiconductor is amorphous and can include indium (In)-containing, zinc (Zn)-containing, tin (Sn)-containing, hafnium (Hf)-containing, and gallium (Ga)-containing oxide semiconductors. Examples of n-type amorphous oxide semiconductors include InGaZnO, InZnO, InHfZnO, InSnZnO, SnZnO, InSnO, GaZnO, and ZnO.

In some implementations, the CMOS TFT includes bottom gate TFTs as discussed above with reference to FIG. 4A. A CMOS TFT device, such as shown in the example of FIG. 12, may be used as part of a driving circuit, for example, of a display device.

Figure 13A:
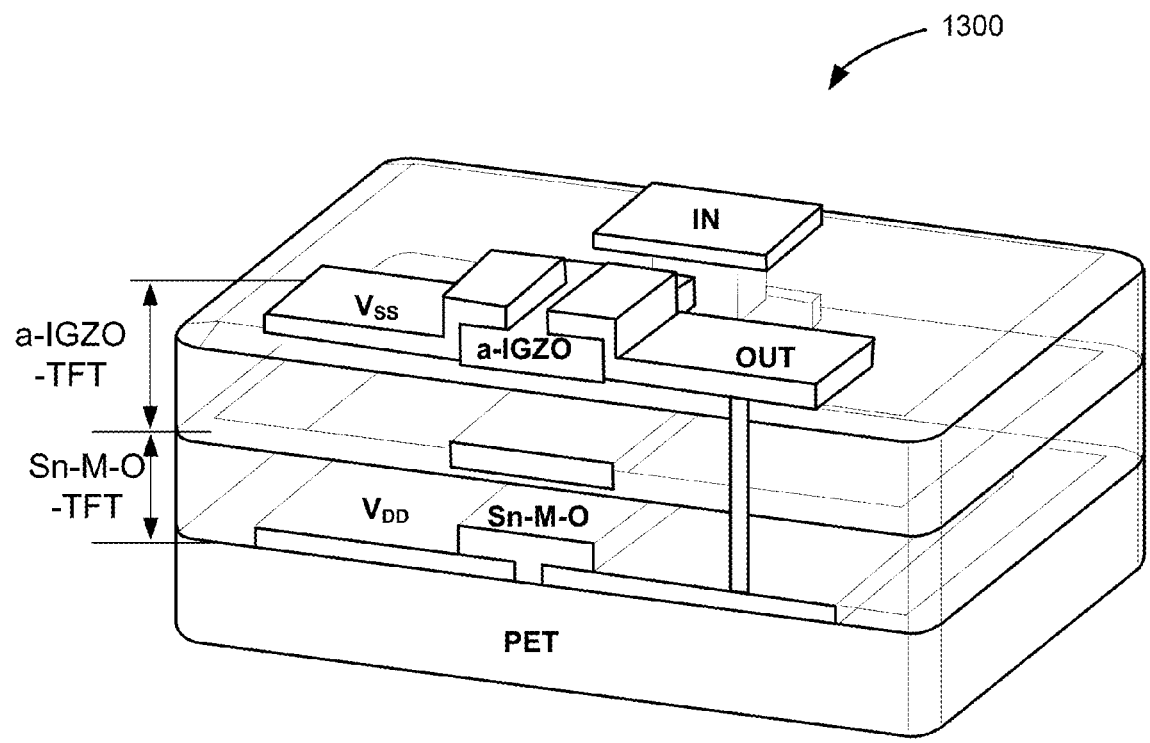
FIG. 13A is an example of a schematic diagram illustrating an all-oxide CMOS inverter on a flexible substrate according to some implementations.

In some implementations, a ternary Sn-based p-type oxide semiconductor layer may be implemented in a flexible all-oxide CMOS TFT device formed on a flexible substrate. FIG. 13A is an example of a schematic diagram illustrating an all-oxide CMOS inverter on a flexible substrate according to some implementations. The all-oxide CMOS inverter 1300 includes an a-IGZO n-channel TFT and a p-channel Sn-M-O p-channel TFT on a flexible PET substrate. All-oxide CMOS inverter may have high cut-off frequencies, due to the relatively high mobility of the oxide channels.

Figure 13B:
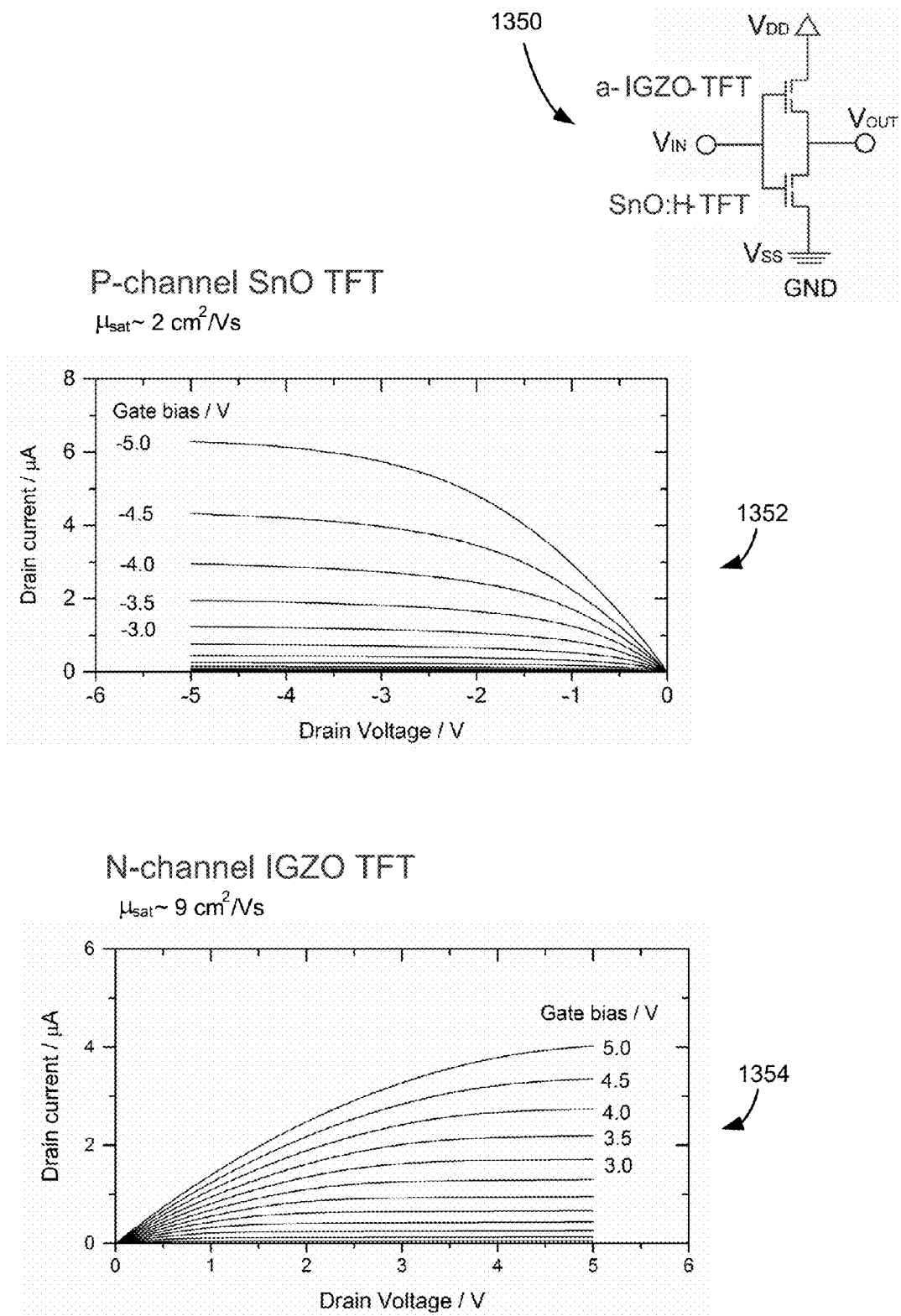
FIGS. 13B and 13C show experimental data for an all-oxide CMOS inverter circuit including a p-channel SnO:H TFT and an n-channel a-IGZO TFT.
Figure 13C:
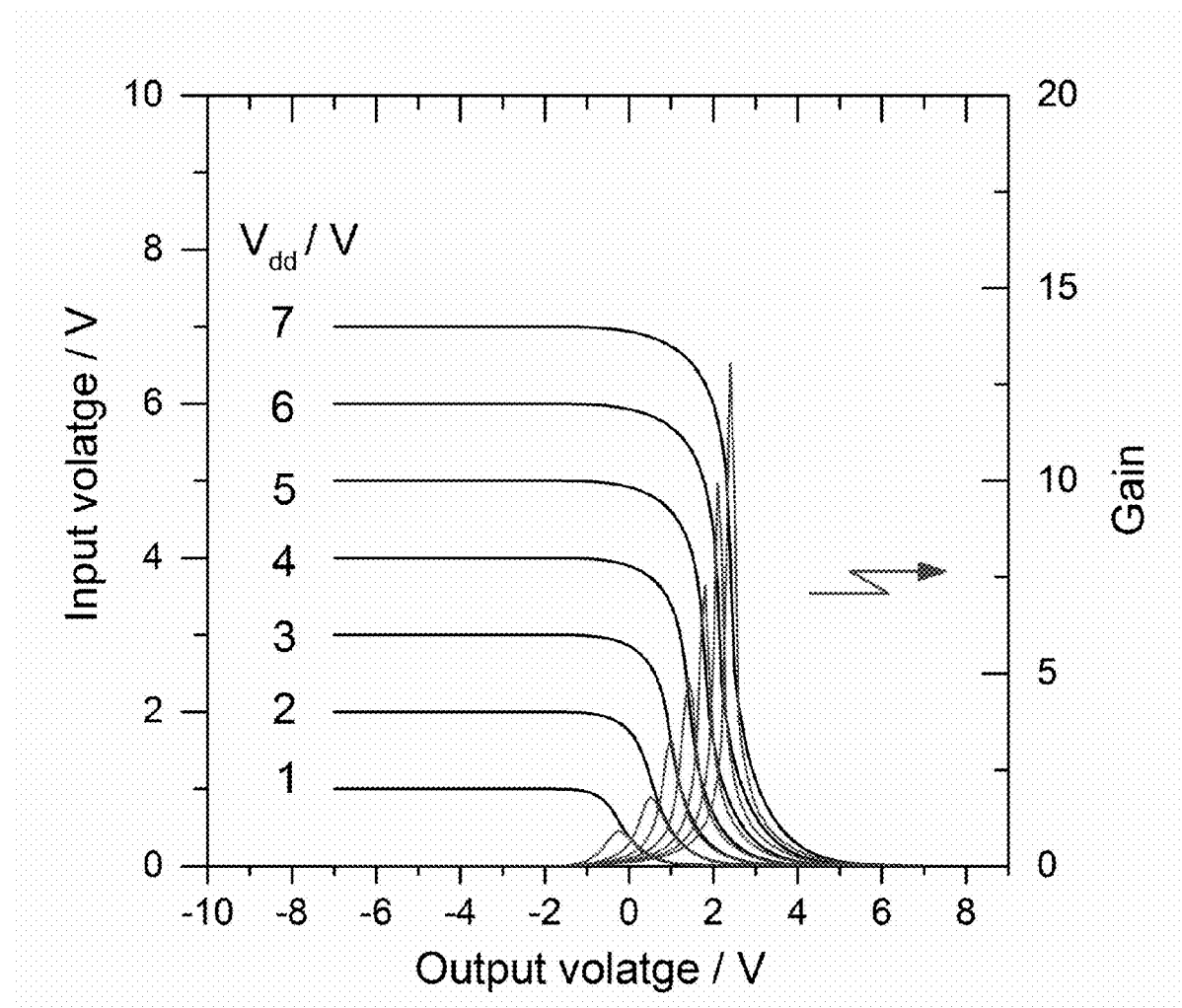

FIGS. 13B and 13C show experimental data for an all-oxide CMOS inverter circuit 1350 including a p-channel SnO:H TFT and an n-channel a-IGZO TFT on a SiO$_2$/n+Si substrate. FIG. 13B shows current-voltage curves 1352 and 1354 for the p-channel SnO:H TFT and the n-channel a-IGZO TFT, respectively. Saturation mobility, $\mu_s$, is about 9 cm$^2$/Vs for the n-channel and about 2 cm$^2$/Vs for the p-channel. FIG. 13C shows voltage transfer characteristics (VTC) of the all-oxide CMOS inverter. It shows clear inverter action with the full swing. The voltage gain, defined as $dV_{OUT}/dV_{IN}$, was greater than 13 at maximum at $V_{dd}=7$ V. It is noted that while the data in FIGS. 13B and 13C reflect a hydrogenated SnO p-channel, similar mobilities and transfer characteristics would be observed for a ternary Sn-based p-channel TFT as described above.

Figure 14A:
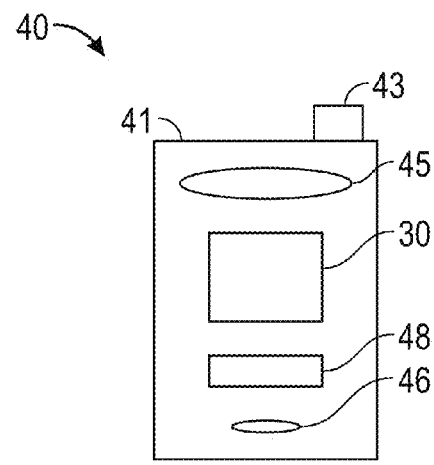
FIGS. 14A and 14B are system block diagrams illustrating a display device that includes a plurality of IMOD display elements.
Figure 14B:
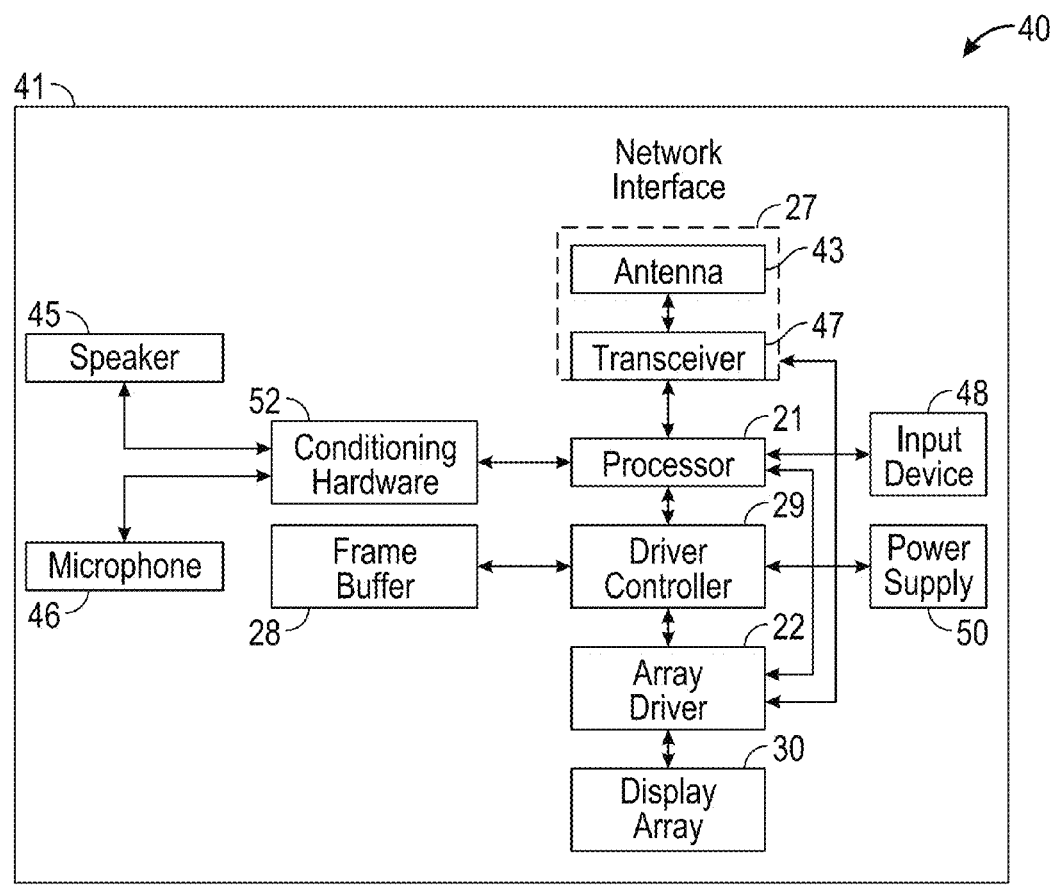

FIGS. 14A and 14B are system block diagrams illustrating a display device 40 that includes a plurality of IMOD display elements and a TFT as described herein. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 14A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 14A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising a thin film transistor (TFT), the TFT comprising:
   a source electrode;
   a drain electrode; and
   a semiconductor channel connecting the source electrode and the drain electrode, the semiconductor channel including a ternary or higher order tin-based (Sn-based) p-type oxide, wherein the ternary or higher order Sn-based p-type oxide comprises Sn (II).

2. The apparatus of claim 1, wherein the ternary or higher order Sn-based p-type oxide comprises a metal selected from the d block or the p block of the periodic table.

3. The apparatus of claim 1, wherein the ternary or higher order Sn-based p-type oxide comprises one or more metals selected from the group consisting of Group 3 metals, Group 4 metals, tungsten (W), boron (B), niobium (Nb), aluminum (Al), gallium (Ga), lead (Pb), and silicon (Si).

4. The apparatus of claim 1, wherein the Sn-based p-type oxide is a Sn-M-O ternary oxide, where Sn is Sn (II) and M is a metal selected from the d block or the p block of the periodic table.

5. The apparatus of claim 4, wherein the Sn-M-O ternary oxide has the formula $Sn_xM_{1-x}O_z$, wherein x is at least 0.2 and z is greater than zero.

6. The apparatus of claim 5, wherein x is between 0.2 and 0.8.

7. The apparatus of claim 1, wherein the Sn-based p-type oxide is $Sn(II)_xB_{1-x}O_z$, where x is between 0.7 and 0.9 and z is greater than zero.

8. The apparatus of claim 1, wherein Sn-based p-type oxide is selected from the group consisting of $Sn(II)_xW_{1-x}O_z$, $Sn(II)_xTi_{1-x}O_z$ and $Sn(II)_xNb_{1-x}O_z$, where x is between 0.3 and 0.8 and z is greater than zero.

9. The apparatus of claim 1, wherein the Sn-based p-type oxide is amorphous.

10. The apparatus of claim 1, wherein the Sn-based p-type oxide has contributions from the Sn 5s orbital in its valence band maximum (VBM).

11. The apparatus of claim 1, wherein the TFT is part of a complementary metal-oxide-semiconductor (CMOS) TFT device.

12. The apparatus of claim 1, wherein the TFT is a bottom gate TFT.

13. The apparatus of claim 1, wherein the TFT is a top gate TFT.

14. The apparatus of claim 1, further comprising:
   a display;
   a processor that is configured to communicate with the display, the processor being configured to process image data; and
   a memory device that is configured to communicate with the processor.

15. The apparatus of claim 14, further comprising:
   a driver circuit configured to send at least one signal to the display; and
   a controller configured to send at least a portion of the image data to the driver circuit.

16. The apparatus of claim 15, wherein the driver circuit includes the TFT.

17. The apparatus of claim 14, further comprising:
   an image source module configured to send the image data to the processor, wherein the image source module includes at least one of a receiver, transceiver, and transmitter.

18. The apparatus of claim 14, further comprising:
   an input device configured to receive input data and to communicate the input data to the processor.

19. The apparatus of claim 1, wherein the ternary or higher order Sn-based p-type oxide comprises one or more metals selected from the group consisting of tungsten (W), titanium (Ti), niobium (Nb), boron (B), lead (Pb), and silicon (Si).

20. An apparatus comprising a thin film transistor (TFT), the TFT comprising:
   a source electrode;
   a drain electrode; and a semiconductor channel connecting the source electrode and the drain electrode, the semiconductor channel including a ternary or higher order tin-based (Sn-based) p-type oxide, wherein the Sn-based p-type oxide is a Sn-M1-M2-O quaternary oxide, where Sn is Sn (II) and M1 and M2 are metals selected from the d block or the p block of the periodic table.

21. A method, comprising:
providing a substrate;
forming a ternary or higher order tin-based (Sn-based) p-type oxide semiconductor layer on the substrate, wherein the ternary or higher order Sn-based p-type oxide comprises Sn (II); and
annealing the Sn-based p-type oxide semiconductor layer.

22. The method of claim 21, wherein the ternary or higher order Sn-based p-type oxide a metal selected from the d block or the p block of the periodic table.

23. The method of claim 21, wherein the ternary or higher order Sn-based p-type oxide one or more metals selected from the group consisting of Group 3 metals, Group 4 metals, tungsten (W), boron (B), niobium (Nb), aluminum (Al), gallium (Ga), lead (Pb) and silicon (Si).

24. The method of claim 21, wherein forming the Sn-based p-type oxide semiconductor layer comprises an atomic layer deposition (ALD) process.

25. The method of claim 21, further comprising forming a gate electrode and a gate dielectric, wherein the gate dielectric is between the Sn-based p-type oxide semiconductor layer and the gate electrode.

26. An apparatus comprising a thin film transistor (TFT), the TFT comprising:
a source electrode;
a drain electrode; and
a semiconductor channel connecting the source electrode and the drain electrode, the semiconductor channel including a ternary or higher order tin-based (Sn-based) p-type oxide, wherein the Sn-based p-type oxide is a Sn-M-O ternary oxide, where Sn is Sn (II) and M is a metal selected from the d block or the p block of the periodic table and wherein the Sn-M-O ternary oxide has the formula $Sn_xM_{1-x}O_z$, wherein x is at least 0.2 and z is greater than zero.

* * * * *